(12) United States Patent
Kamachi et al.

(10) Patent No.: US 8,975,119 B2
(45) Date of Patent: Mar. 10, 2015

(54) MANUFACTURING METHOD OF SEMICONDUCTOR DEVICE

(71) Applicant: Renesas Electronics Corporation, Kanagawa (JP)

(72) Inventors: Katsuhito Kamachi, Itami (JP); Takanori Okita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/795,374

(22) Filed: Mar. 12, 2013

(65) Prior Publication Data
US 2013/0244381 A1    Sep. 19, 2013

(30) Foreign Application Priority Data
Mar. 19, 2012  (JP) .................................. 2012-062149

(51) Int. Cl.
| H01L 21/00 | (2006.01) |
| H01L 21/50 | (2006.01) |
| H01L 23/00 | (2006.01) |
| H01L 23/495 | (2006.01) |
| H01L 21/48 | (2006.01) |

(52) U.S. Cl.
CPC ................ *H01L 21/50* (2013.01); *H01L 24/97* (2013.01); *H01L 23/49562* (2013.01); *H01L 21/4842* (2013.01); *H01L 2924/13091* (2013.01); *H01L 2224/48247* (2013.01); *H01L 2224/97* (2013.01); *H01L 2224/48091* (2013.01); *H01L 2224/48465* (2013.01); *H01L 24/45* (2013.01); *H01L 24/48* (2013.01); *H01L 2224/45124* (2013.01); *H01L 2224/45144* (2013.01); *H01L 2224/45147* (2013.01); *H01L 2224/83439* (2013.01); *H01L 2224/85439* (2013.01); *H01L 2224/92247* (2013.01); *H01L 2924/0132* (2013.01); *H01L 24/29* (2013.01); *H01L 24/32* (2013.01); *H01L 24/73* (2013.01); *H01L 24/83* (2013.01); *H01L 24/85* (2013.01); *H01L 2224/29111* (2013.01); *H01L 2224/29144* (2013.01); *H01L 2224/29339* (2013.01); *H01L 2224/32245* (2013.01); *H01L 2224/73265* (2013.01); *H01L 2224/83805* (2013.01); *H01L 2224/8385* (2013.01); *H01L 2224/85207* (2013.01); *H01L 2924/07811* (2013.01); *H01L 2224/29101* (2013.01)
USPC ........................................................ 438/123

(58) Field of Classification Search
None
See application file for complete search history.

(56) References Cited

U.S. PATENT DOCUMENTS

| 6,107,676 | A  | * | 8/2000 | Suzuki ........................... 257/666 |
| 2003/0052405 | A1 | * | 3/2003 | Moriguchi ..................... 257/706 |

(Continued)

FOREIGN PATENT DOCUMENTS

| JP | 62-237717 A | 10/1987 |
| JP | 08-046106 A | 2/1996 |

*Primary Examiner* — Zandra Smith
*Assistant Examiner* — Andre' C Stevenson
(74) *Attorney, Agent, or Firm* — Mattingly & Malur, PC

(57) ABSTRACT

A manufacturing yield of a semiconductor device including a power transistor is improved. When forming a tip portion LE1c of a first lead, a tip portion LE2c of a second lead, and a tip portion LE3c of a third lead by using a spanking die SDM1, the tip portion LE1c of the first lead, the tip portion LE2c of the second lead, and the tip portion LE3c of the third lead are pressed by an upper surface of a protrusion portion provided on a pressing surface of a lower die SD1 and a bottom surface of a groove portion provided in a pressing surface of an upper die SU1, and a bent portion of the second lead and a bent portion of the third lead are pressed by a flat pressing surface of the lower die SD1 and a flat pressing surface of the upper die SU1.

13 Claims, 38 Drawing Sheets

(56) References Cited

U.S. PATENT DOCUMENTS

| | | | |
|---|---|---|---|
| 2003/0136573 A1* | 7/2003 | Miyaki et al. | 174/52.4 |
| 2003/0209815 A1* | 11/2003 | Ito et al. | 257/797 |
| 2004/0046240 A1* | 3/2004 | Hasebe et al. | 257/678 |
| 2004/0145043 A1* | 7/2004 | Hayashi et al. | 257/696 |

* cited by examiner

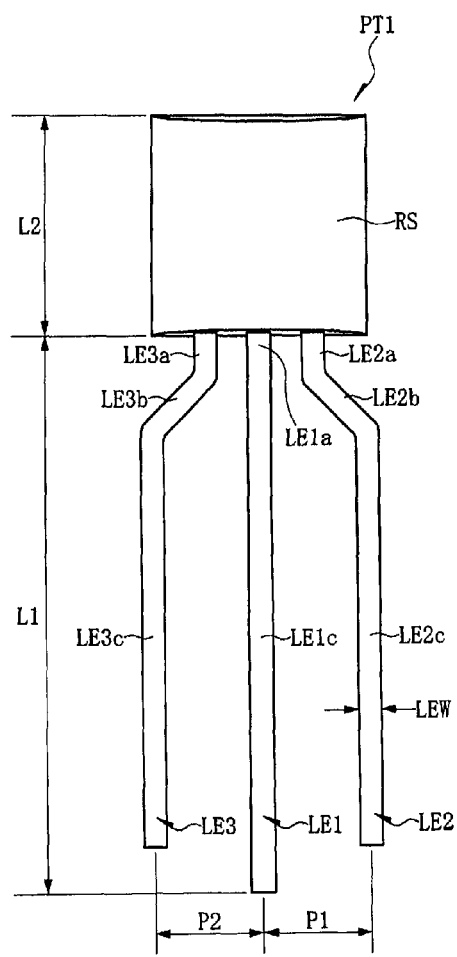
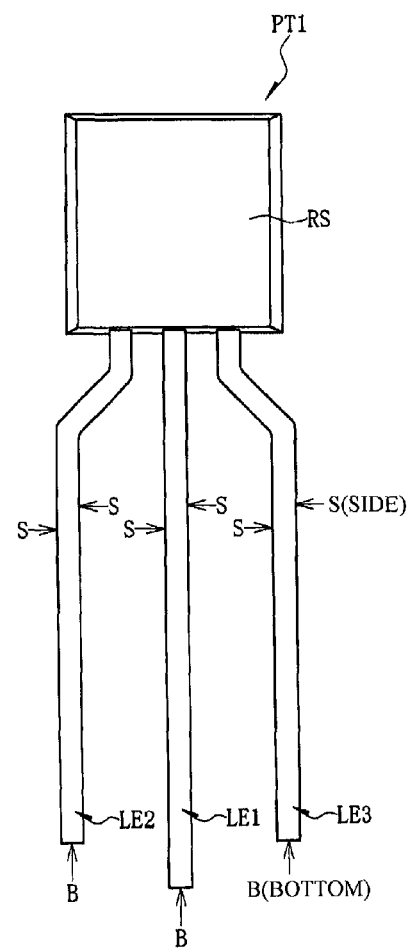
FIG. 1A
FIG. 1B

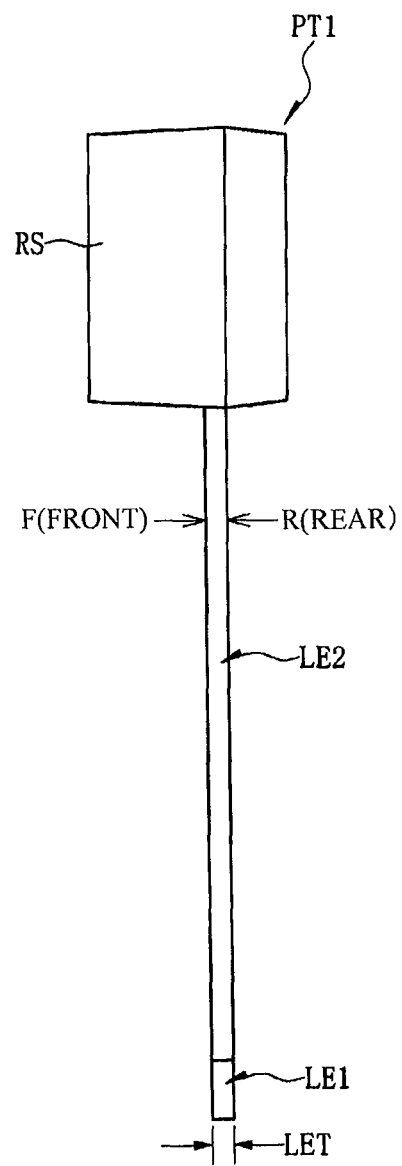

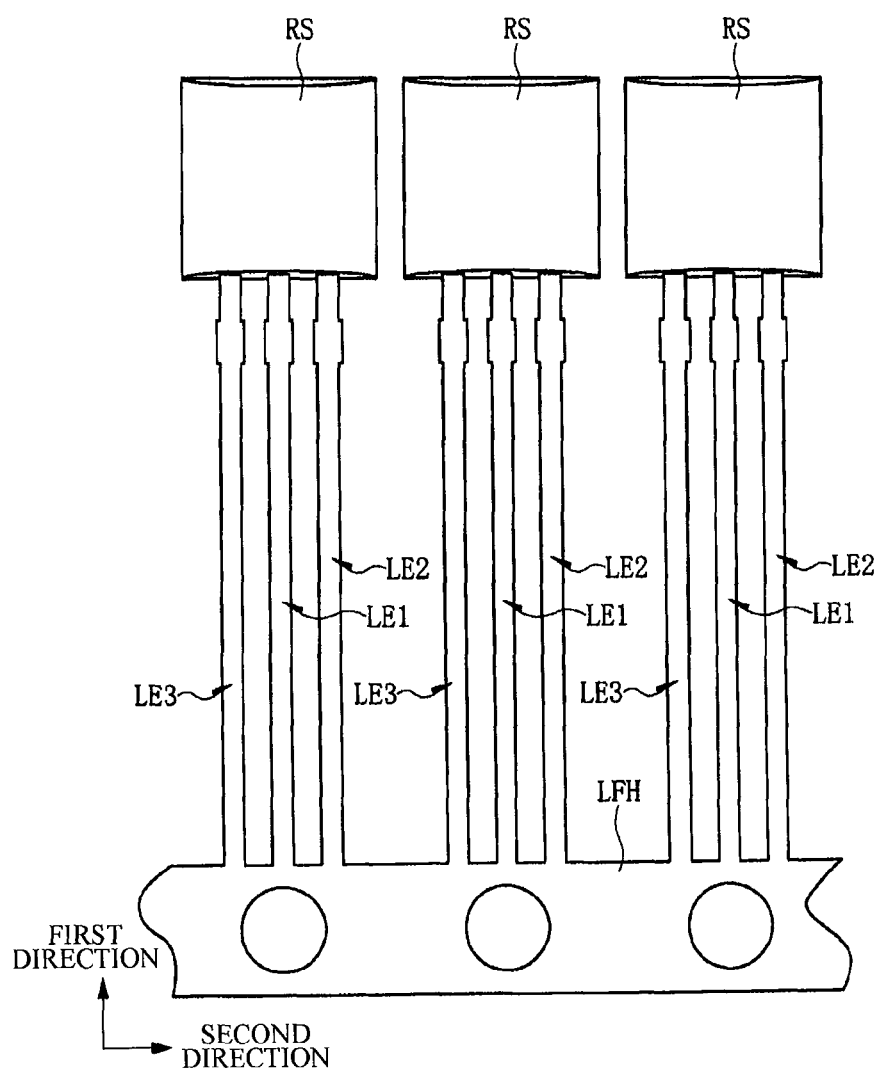

FIG. 16
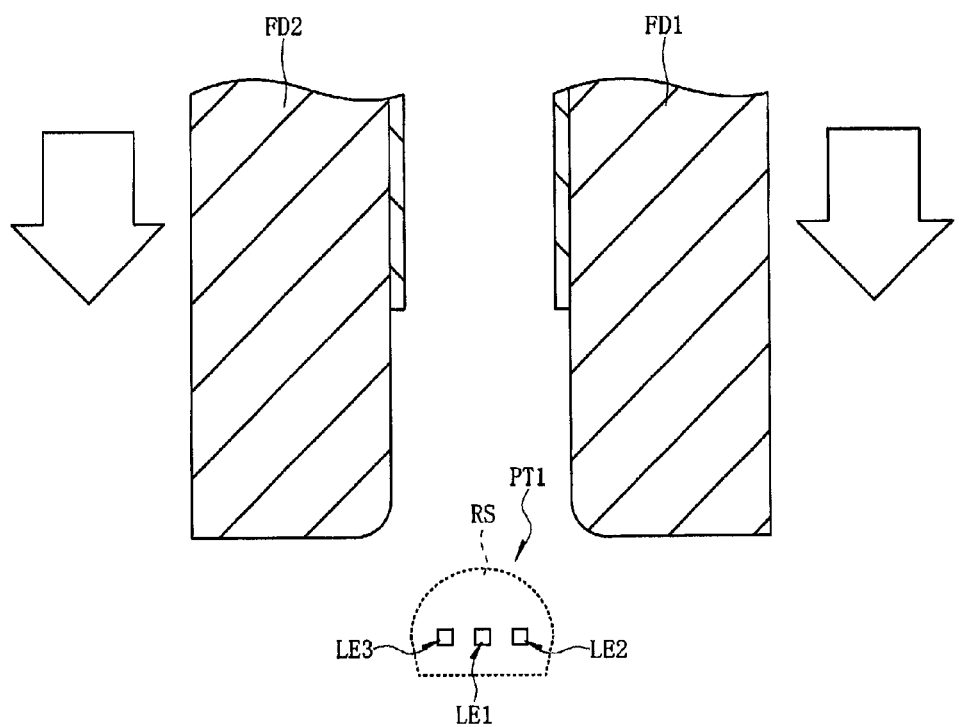
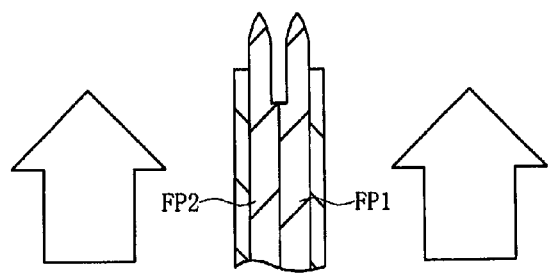

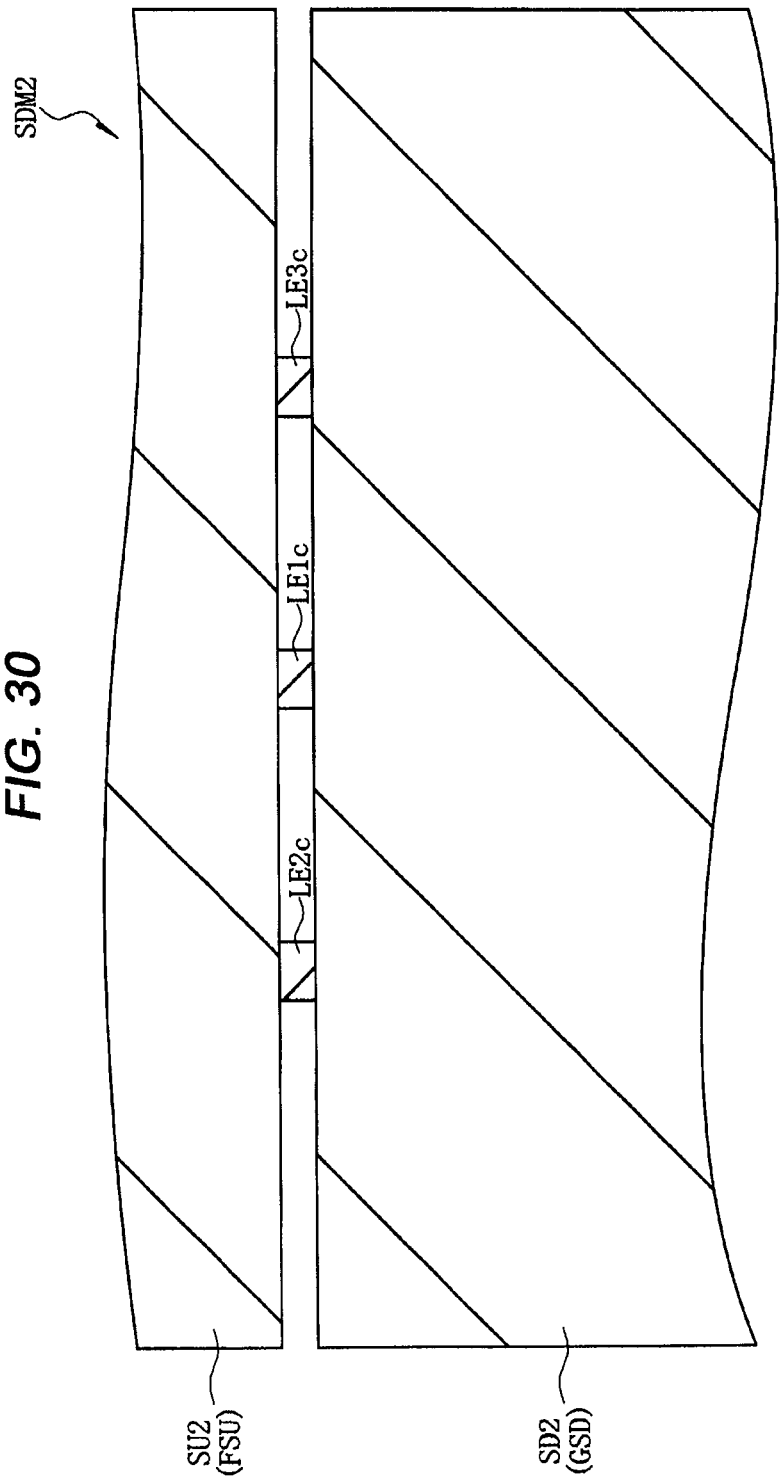

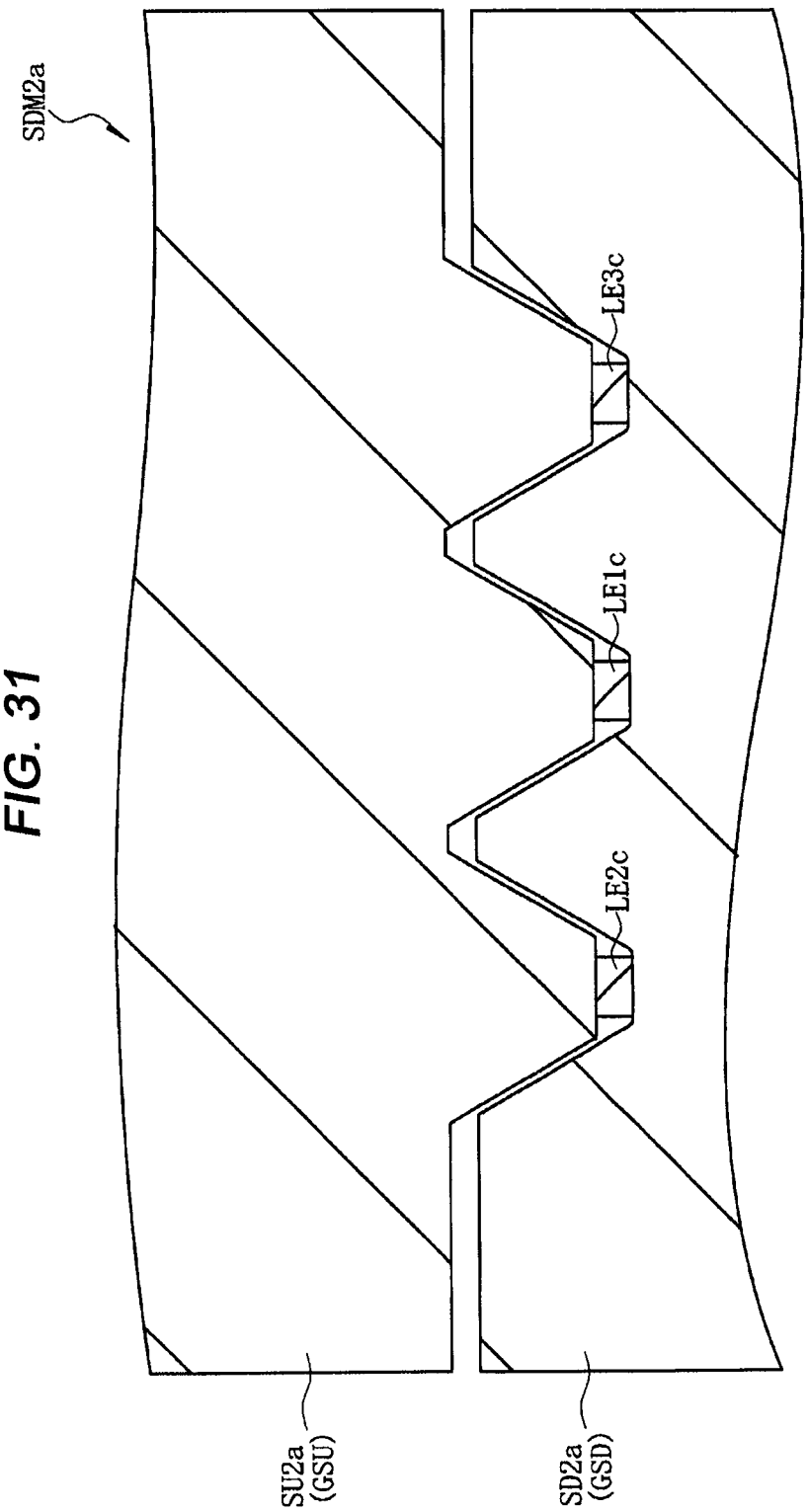

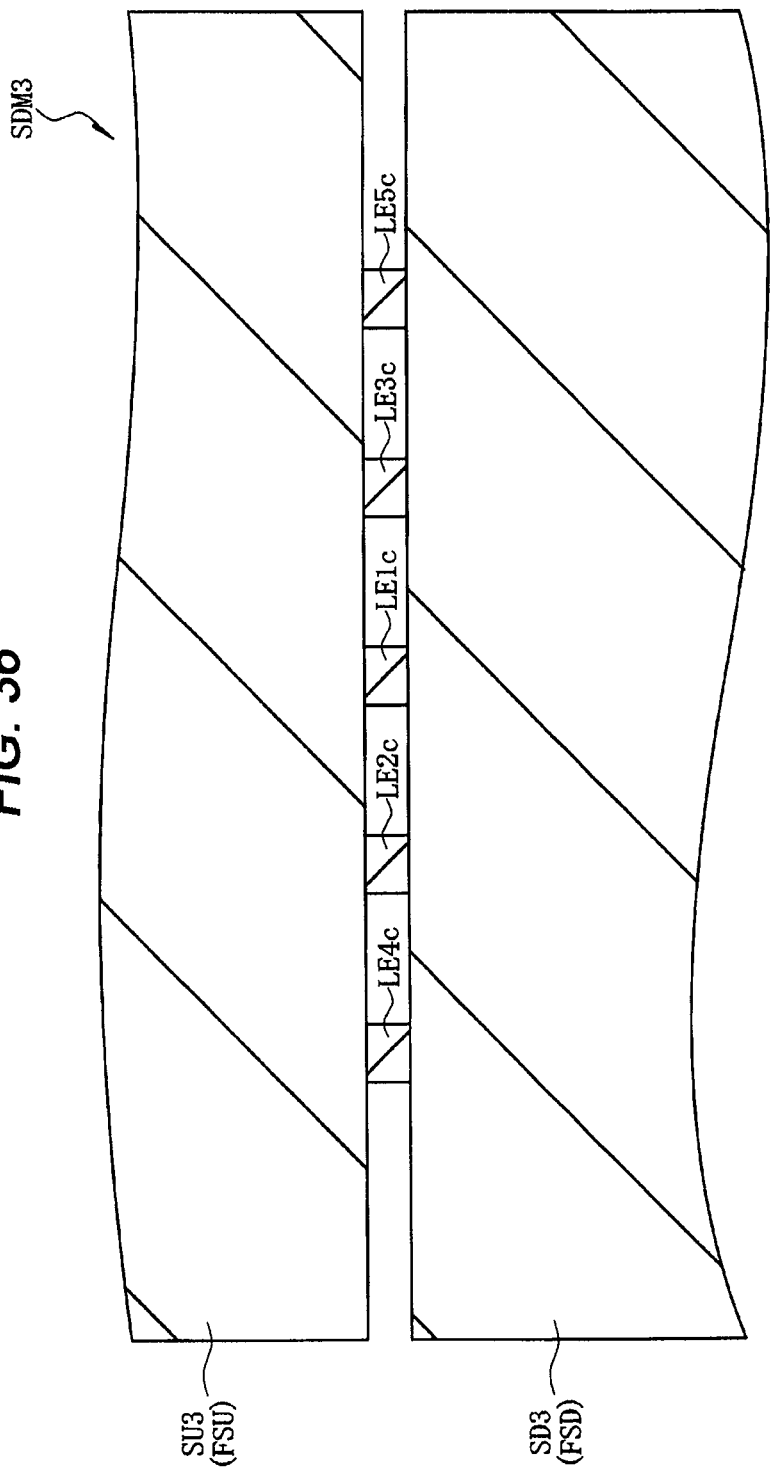

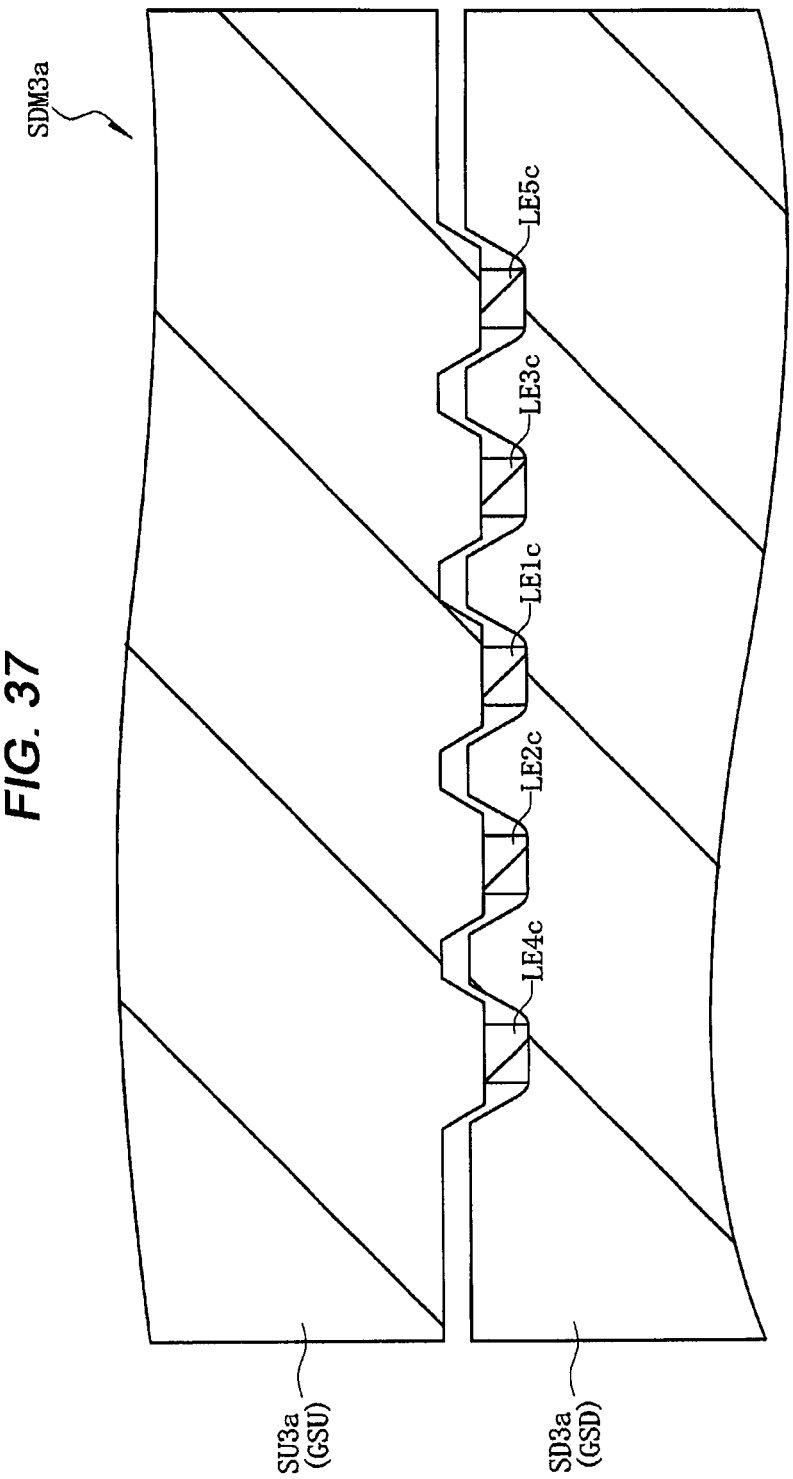

MANUFACTURING METHOD OF SEMICONDUCTOR DEVICE

CROSS-REFERENCE TO RELATED APPLICATION

The disclosure of Japanese Patent Application No. 2012-062149 filed on Mar. 19, 2012 including the specification, drawings and abstract is incorporated herein by reference in its entirety.

BACKGROUND

The present invention relates to a manufacturing method of a semiconductor device, and for example, can be suitably used for a semiconductor device having a plurality of leads (external terminals) and including a power transistor.

When the leads (external terminals) included in the semiconductor device are inserted and coupled to a plurality of mounting holes formed in a wiring substrate, it is necessary to process the shapes of the leads, and to match the pitch of the leads and the pitch of the mounting holes.

For example, Japanese Patent Laid-Open No. 1987-237717 (Patent Document 1) discloses a processing method of the leads in which roots of the leads are pressed by a root pressing arm and tips of the leads are pressed by a tip pressing arm, and then a tip of a processing arm lowers while leads support tables are pressed and opened to right and left, and thus intermediate portions of the leads are bent by the processing arm. A pedestal pressing the leads includes walls for pressing each of the roots of the leads, the intermediate portions of the leads, and the tips of the leads.

Furthermore, Japanese Patent Laid-Open No. 1996-46106 (Patent Document 2) discloses a method in which in an external terminal bending apparatus, a lower end taper portion breaks into a taper hole of a movable main body and presses and opens the movable main body to the right and left, and thus an engaging end of an engaging member engages the external terminals of the semiconductor device and the external terminals are plastically deformed into a crank shape along a bending die of a concave portion.

SUMMARY

For example, in a semiconductor device including three leads (external terminals), two outside leads include a root portion, a tip portion, and a bent portion between the root portion and the tip portion, which protrude from a resin sealing body that seals the semiconductor chip. However, there is a problem in which a product standard of the shape of the leads is not satisfied due to deformation of the tip portions in processing the shape of the leads, and a manufacturing yield of the semiconductor device decreases.

The other problems and the new feature will become clear from the description of the present specification and the accompanying drawings.

According to an embodiment, when the tip portions of the deformed leads are aligned, not only the tip portions of the leads, but also the bent portions of the leads are pressed by a die.

According to an embodiment of the present invention, the manufacturing yield of the semiconductor device can be increased.

BRIEF DESCRIPTION OF THE DRAWINGS

FIGS. 1A and 1B are a front view and a rear view, respectively, of a three-terminal semiconductor device according to a first embodiment;

FIG. 2 is a side view of the three-terminal semiconductor device according to the first embodiment;

FIG. 10 is a principle part plan view (front view) of the semiconductor device in a tie bar cutting step according to the first embodiment;

FIG. 16 is a principle part cross-sectional view (a principle part cross-sectional view taken along a line B-B in FIG. 15) showing the molding die and the semiconductor device before the processing in the lead bending step according to the first embodiment;

FIG. 30 is a principle part cross-sectional view showing bent portions of the leads pressed by the spanking die in the lead tip alignment step according to the second embodiment;

FIG. 31 is a principle part cross-sectional view showing another example of the bent portions of the leads pressed by the spanking die in the lead tip alignment step according to the second embodiment;

FIG. 36 is a principle part cross-sectional view showing bent portions of the leads pressed by the spanking die in the lead tip alignment step according to the modification of the second embodiment;

FIG. 37 is a principle part cross-sectional view showing another example of the bent portions of the leads pressed by the spanking die in the lead tip alignment step according to the modification of the second embodiment.

DETAILED DESCRIPTION

Figure 3:
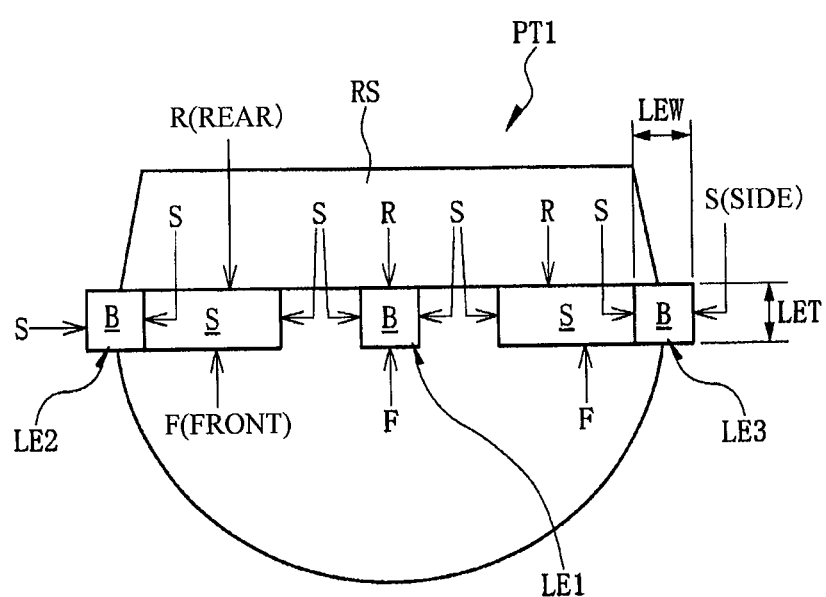
FIG. 3 is a bottom view of the three-terminal semiconductor device according to the first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, or position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In addition, in the drawings used in the embodiments, in order to make a drawing intelligible even if it is a plan view, hatching may be attached. Furthermore, in all the drawings for explaining embodiments, the same symbol is attached to the member having the same function, as a principle, and the repeated explanation thereof is omitted. Hereinafter, embodiments of the present invention will be described in detail with reference to the drawings.

(Detailed Problems and Effects)

Figure 38A:
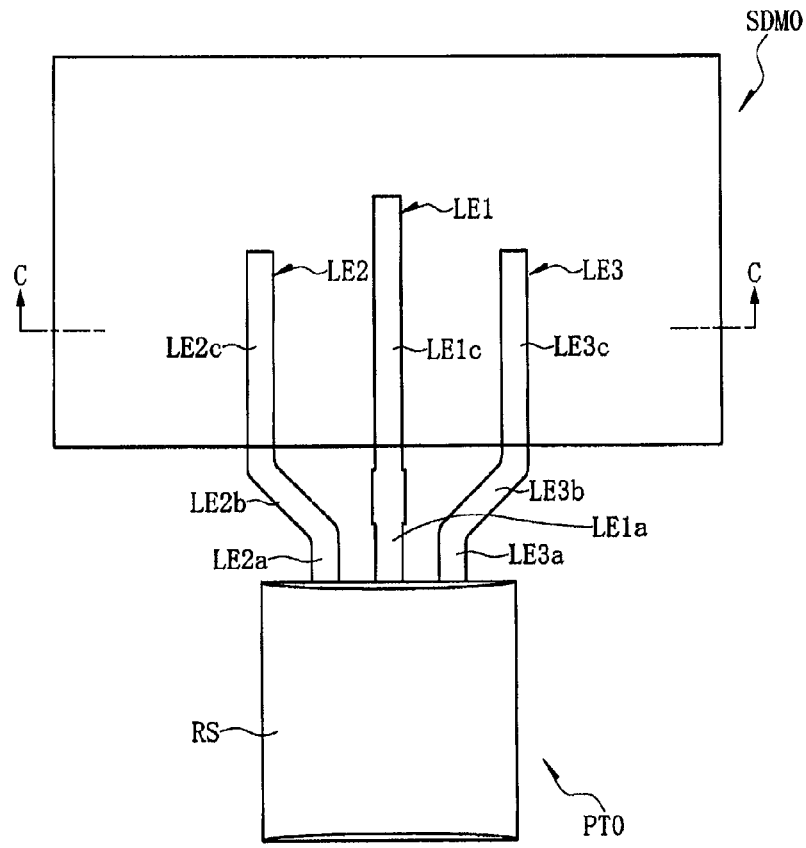
FIG. 38A is a principle part plan view showing a spanking die and a semiconductor device in a lead tip alignment step studied by the inventors as seen through an upper die.
Figure 38B:
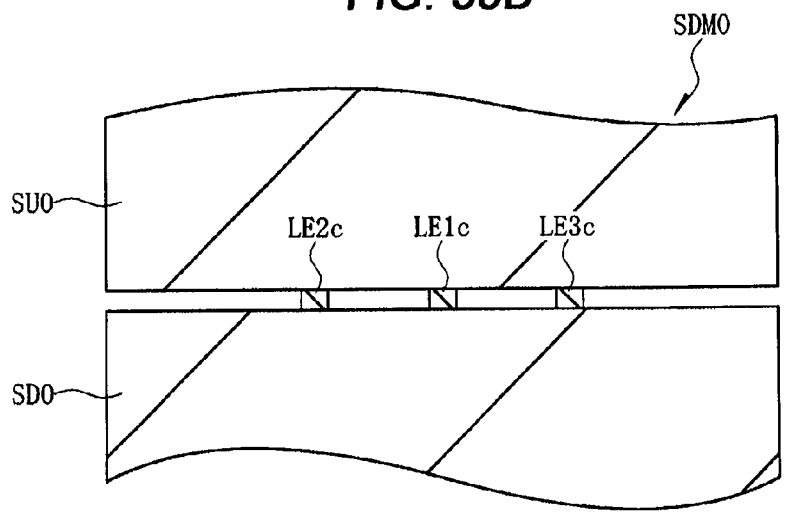
FIG. 38B is a principle part cross-sectional view taken along a line C-C in FIG. 38A.

For example, as shown in FIGS. 38A and 38B, a three-terminal semiconductor device PT0 has a structure in which three leads (external terminals), that is, a first lead LE1, a second lead LE2, and a third lead LE3, protrude from a lower surface (bottom surface or lower end) of a resin sealing body (a sealing body) RS that seals a semiconductor chip (not shown in the drawings).

The semiconductor chip is mounted on a chip mounting portion coupled to the first lead LE1, and for example, a power MOSFET (Metal Oxide Semiconductor Field Effect Transistor) is formed in the semiconductor chip. The first lead LE1 is electrically coupled to the drain of the power MOSFET, the second lead LE2 is electrically coupled to the gate of the power MOSFET, and the third lead LE3 is electrically coupled to the source of the power MOSFET.

The second lead LE2 and the third lead LE3 are spaced apart from each other and protrude from the lower surface of the resin sealing body RS. In addition, between the second lead LE2 and the third lead LE3, the first lead LE1 is spaced apart from the second lead LE2 and the third lead LE3 and protrudes from the lower surface of the resin sealing body RS. Therefore, the second lead LE2 and the third lead LE3 are respectively spaced apart from the first lead LE1 and located outside the first lead LE1.

The first lead LE1 includes a linear-shaped root portion (first portion) LE1a in contact with the lower surface of the resin sealing body RS and a linear-shaped tip portion (third portion) LE1c coupled to the root portion LE1a.

In contrast, the second lead LE2 includes a linear-shaped root portion (first portion) LE2a in contact with the lower surface of the resin sealing body RS, a linear-shaped tip portion (third portion) LE2c, and a bent portion (second portion) LE2b with one end being coupled to the root portion LE2a and the other end being coupled to the tip portion LE2c. A pitch (distance) between the tip portion LE1c of the first lead LE1 and the tip portion LE2c of the second lead LE2 is larger than a pitch between the root portion LE1a of the first lead LE1 and the root portion LE2a of the second lead LE2.

Similarly, the third lead LE3 includes a linear-shaped root portion (first portion) LE3a in contact with the lower surface of the resin sealing body RS, a linear-shaped tip portion (third portion) LE3c, and a bent portion (second portion) LE3b with one end being coupled to the root portion LE3a and the other end being coupled to the tip portion (third portion) LE3c. A pitch between the tip portion LE1c of the first lead LE1 and the tip portion LE3c of the third lead LE3 is larger than a pitch between the root portion LE1a of the first lead LE1 and the root portion LE3a of the third lead LE3.

In this way, the reason why the bent portion is formed in the second lead LE2 and the third lead LE3 is because of causing a pitch of the mounting holes formed in the wiring substrate on which the three-terminal semiconductor device PT0 is mounted, to agree with the pitch between the tip portion LE1c of the first lead LE1 and the tip portion LE2c of the second lead LE2 provided in the three-terminal semiconductor device PT0, and the pitch between the tip portion LE1c of the first lead LE1 and the tip portion LE3c of the third lead LE3 included in the three-terminal semiconductor device PT0, respectively.

However, there exist various technical problems to be described in the following, when manufacturing the three-terminal semiconductor device PT0.

(1) When forming the bent portions LE2b and LE3b in the second lead LE2 and the third lead LE3 respectively, each of the tip portions LE2c and LE3c in the second lead LE2 and the third lead LE3 is also deformed by a processing strain remaining in the bent portions LE2b and LE3b. Therefore, in the following steps, the deformed tip portions LE2c and LE3c need to be aligned into a linear shape. Hence, for example, as shown in FIGS. 38A and 38B described above, a spanking die SDM0 including a lower die SD0 and an upper die SU0 is used, and a flat upper surface of the lower die SD0 and a flat lower surface of the upper die SU0 press the tip portions LE1c, LE2c, and LE3c of the first lead LE1, the second lead LE2, and the third lead LE3, respectively. Because of this, the tip portions LE1c, LE2c, and LE3c of the first lead LE1, the second lead LE2, and the third lead LE3 are aligned respectively.

However, when the lengths of the first lead LE1, the second lead LE2, and the third lead LE3 become large, it is difficult to cause the pitch between the tip portion LE1c of the first lead LE1 and the tip portion LE2c of the second lead LE2 and the pitch between the tip portion LE1c of the first lead LE1 and the tip portion LE3c of the third lead LE3, respectively, to agree with the pitch of the mounting holes formed in the wiring substrate on which the semiconductor device PT0 is mounted.

This is because of the following reason. That is, unevenness of the tip portions LE1c, LE2c, and LE3c in the first lead LE1, the second lead LE2, and the third lead LE3, respectively, are generated by the processing strain remaining in the bent portion LE2b of the second lead LE2 and the bent portion LE3b of the third lead LE3. Even when the lengths of the first lead LE1, the second lead LE2, and the third lead LE3 are increased, the amounts of the processing strain remaining in the bent portion LE2b of the second lead LE2 and the bent portion LE3b of the third lead LE3 do not increase remarkably and are approximately the same. However, the larger the lengths of the first lead LE1, the second lead LE2, and the third lead LE3 are, the larger the distances between the tip portions LE1c, LE2c, and LE3c of the first lead LE1, the second lead LE2, and the third lead LE3 become, respectively, (the more difficult the tip portions LE1c, LE2c, and LE3c become to be aligned). This is the reason of the above.

(2) In addition, the cross-sectional shape of the first lead LE1, the second lead LE2, and the third lead LE3 is rectangular. Therefore, when forming the bent portions LE2b and LE3b in the second lead LE2 and the third lead LE3, the processing strain is easily concentrated at an angular portion of the bent portions LE2b and LE 3b in the second lead LE2 and the third lead LE3, and thus the amounts of deformation of the tip portions LE2c and LE3c in the second lead LE2 and the third lead LE3 are larger than those of leads having a circular cross-sectional shape (see Patent Document 1).

(3) Furthermore, in recent years, in order to secure yield of mounting of the semiconductor device PT0, a control value (standard) of variation of the tip portions LE1c, LE2c, and LE3c of the first lead LE1, the second lead LE2, and the third lead LE3, respectively, has become small, and thus the above-mentioned spanking die SDM0 cannot satisfy the control value and a manufacturing yield of the semiconductor device PT0 itself decreases significantly.

In the present embodiment is disclosed a technique in which in a semiconductor device including a plurality of leads, in particular, in a three-terminal power transistor and a five-terminal power transistor, the manufacturing yield of the semiconductor device can be improved by setting the pitches between the tip portions of the leads to a value smaller than a standard value (by reducing unevenness of the lead tip portions).

First Embodiment

<<Semiconductor Device>>

A structure of a semiconductor device including a plurality of leads according to a first embodiment will be described using FIGS. 1 to 3. Here, a three-terminal semiconductor device will be exemplified as a semiconductor device including leads. FIGS. 1A and 1B are a front view and a rear view, respectively, of the three-terminal semiconductor device. FIG. 2 is a side view of the three-terminal semiconductor device. FIG. 3 is a bottom view of the three-terminal semiconductor device.

As shown in FIGS. 1 to 3, a three-terminal semiconductor device PT1 has a structure in which three leads (external terminals), which are a first lead LE1, a second lead LE2, and a third lead LE3, protrude from a lower surface (bottom surface or lower end) of a resin sealing body (a sealing body) RS that seals a semiconductor chip (not shown in the drawings).

The semiconductor chip is mounted on a chip mounting portion coupled to the first lead LE1, and for example, a power transistor is formed in the semiconductor chip. Here, a power MOSFET is exemplified as the power transistor. Therefore, the first lead LE1 is electrically coupled to the drain of the power MOSFET, the second lead LE2 is electrically coupled to the gate of the power MOSFET, and the third lead LE3 is electrically coupled to the source of the power MOSFET. In other words, it can be said that the first lead LE1 is a drain lead, the second lead LE2 is a gate lead, and the third lead LE3 is a source lead.

The second lead LE2 and the third lead LE3 are spaced apart from each other and protrude from the lower surface of the resin sealing body RS. In addition, between the second lead LE2 and the third lead LE3, the first lead LE1 is spaced apart from the second lead LE2 and the third lead LE3, and protrudes from the lower surface of the resin sealing body RS. Therefore, the second lead LE2 and the third lead LE3 are spaced apart from the first lead LE1 and located outside the first lead LE1. Meanwhile, although here is an example in which the first lead LE1 is arranged between the second lead LE2 and the third lead LE3, the arrangement of the first lead LE1, the second lead LE2, and the third lead LE3 is not limited to this arrangement.

The first lead LE1 includes a linear-shaped root portion (first portion) LE1a in contact with the lower surface of the resin sealing body RS and a linear-shaped tip portion (third portion) LE1c coupled to the root portion LE1a. Meanwhile, the tip portion LE1c is a portion which is inserted into a mounting hole formed in a wiring substrate and which is electrically coupled to the wiring substrate via solder or the like.

In contrast, the second lead LE2 includes a linear-shaped root portion (first portion) LE2a in contact with the lower surface of the resin sealing body RS, a linear-shaped tip portion (third portion) LE2c, and a bent portion (second portion) LE2b with one end being coupled to the root portion LE2a and the other end being coupled to the tip portion LE2c. A pitch between the tip portion LE1c of the first lead LE1 and the tip portion LE2c of the second lead LE2 is larger than a pitch between the root portion LE1a of the first lead LE1 and the root portion LE2a of the second lead LE2. Meanwhile, the tip portion LE2c is a portion which is inserted into a mounting hole formed in the wiring substrate and which is electrically coupled to the wiring substrate via solder or the like.

Similarly, the third lead LE3 includes a linear-shaped root portion (first portion) LE3a in contact with the lower surface of the resin sealing body RS, a linear-shaped tip portion (third portion) LE3c, and a bent portion (second portion) LE3b with one end being coupled to the root portion LE3a and the other end being coupled to the tip portion LE3c. A pitch between the tip portion LE1c of the first lead LE1 and the tip portion LE3c of the third lead LE3 is larger than a pitch between the root portion LE1a of the first lead LE1 and the root portion LE3a of the third lead LE3. Meanwhile, the tip portion LE3c is a portion which is inserted into a mounting hole formed in the wiring substrate and which is electrically coupled to the wiring substrate via solder or the like.

In addition, the pitch between the tip portion LE1c of the first lead LE1 and the tip portion LE2c of the second lead LE2 provided in the three-terminal semiconductor device PT1 is the same as the pitch between the tip portion LE1c of the first lead LE1 and the tip portion LE3c of the third lead LE3.

The reason why the bent portions LE2b and LE3b are formed in the second lead LE2 and the third lead LE3 respectively is because of causing a pitch of the mounting holes formed in the wiring substrate on which the three-terminal semiconductor device PT1 is mounted, to agree with the pitch between the tip portion LE1c of the first lead LE1 and the tip portion LE2c of the second lead LE2 provided in the three-terminal semiconductor device PT1, and the pitch between the tip portion LE1c of the first lead LE1 and the tip portion LE3c of the third lead LE3 provided in the three-terminal semiconductor device PT1, respectively.

The cross-sectional shape of the first lead LE1, the second lead LE2, and the third lead LE3 is rectangular. In the description below, surfaces of the first lead LE1, the second lead LE2, and the third lead LE3 are, respectively, referred to as a front surface (first surface), a rear surface (second surface), a side surface (third surface), and a bottom surface (fourth surface). The front surface is a surface indicated by a symbol F in FIGS. 2 and 3. The rear surface is a surface indicated by a symbol R in FIGS. 2 and 3. The rear surface is a surface opposite to the front surface. The side surface is a surface indicated by a symbol S in FIGS. 1B and 3, and the bottom surface is a surface indicated by a symbol B in FIGS. 1B and 3.

A length of a side of a cross-section of the first lead LE1, the second lead LE2, and the third lead LE3 on the front surface and the rear surface (a lead width indicated by a symbol LEW in FIGS. 1A and 3) is larger than a length of a side of a cross-section of the first lead LE1, the second lead LE2, and the third lead LE3 on the side surface (a lead thickness (depth) indicated by a symbol LET in FIGS. 2 and 3). For example, the length of a side of a cross-section of the first lead LE1, the second lead LE2, and the third lead LE3 on the front surface and the rear surface (the lead width LEW) is 0.5 mm. For example, the length of a side of a cross-section of the first lead LE1, the second lead LE2, and the third lead LE3 on the side surface (the lead thickness LET) is 0.4 mm.

As shown in FIG. 1A, a lead length L1 of the first lead LE1 protruding from the lower surface of the resin sealing body RS is twice or more a sealing body length L2 of the resin sealing body RS in a direction in which the first lead LE1 extends. For example, the lead length L1 of the first lead LE1 protruding from the lower surface of the resin sealing body RS is 12.5 mm and the sealing body length L2 of the resin sealing body RS is 5.0 mm.

As shown in FIG. 1A, a pitch P1 from the center of the cross-section of the first lead LE1 to the center of the cross-section of the tip portion LE2c of the second lead LE2 is, for example, in a range from (2.5+0.4) mm to (2.5−0.1) mm. Similarly, a pitch P2 from the center of the cross-section of the first lead LE1 to the center of the cross-section of the tip portion LE3c of the third lead LE3 is, for example, in a range from (2.5+0.4) mm to (2.5−0.1) mm.

<<Manufacturing Method of Semiconductor Device>>

Next, a manufacturing method of the three-terminal semiconductor device PT1 according to the first embodiment will be described in order of steps with reference to FIGS. 4 to 26. A semiconductor chip where a power transistor is formed will be exemplified as a semiconductor chip included in the three-terminal semiconductor device PT1 described here. Furthermore, a power MOSFET is exemplified as the power transistor.

Figure 4:
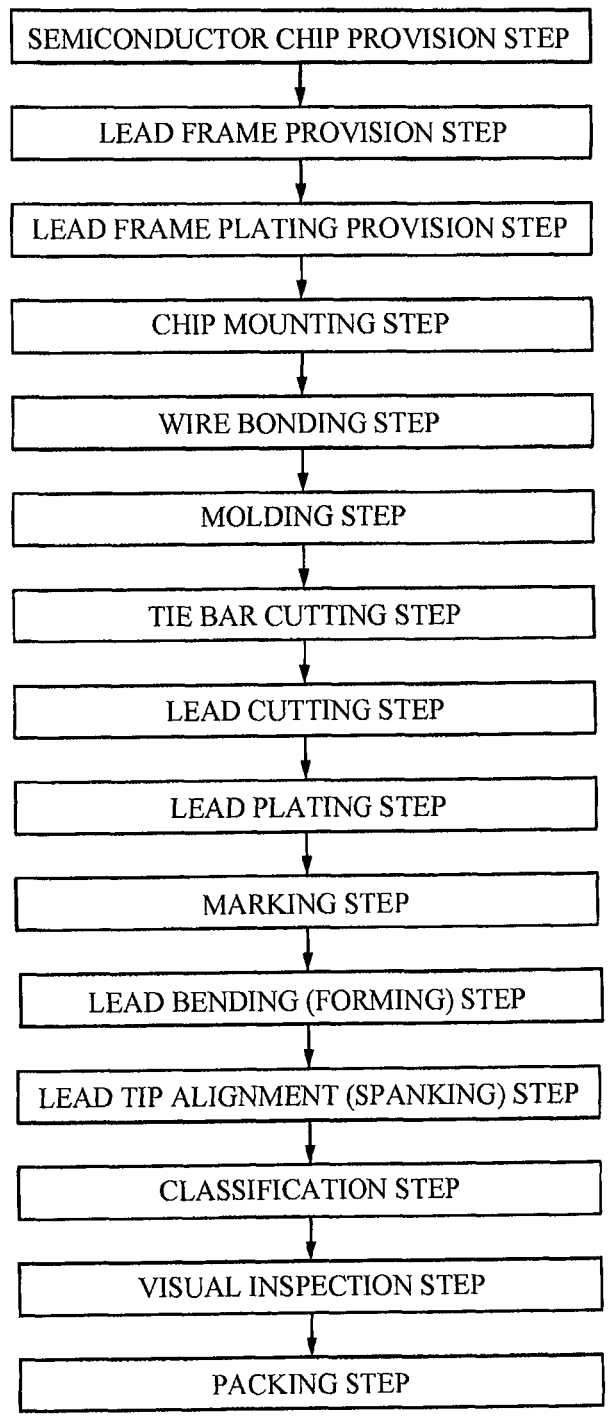
FIG. 4 is a step diagram of a manufacturing method of the semiconductor device according to the first embodiment.
Figure 5:
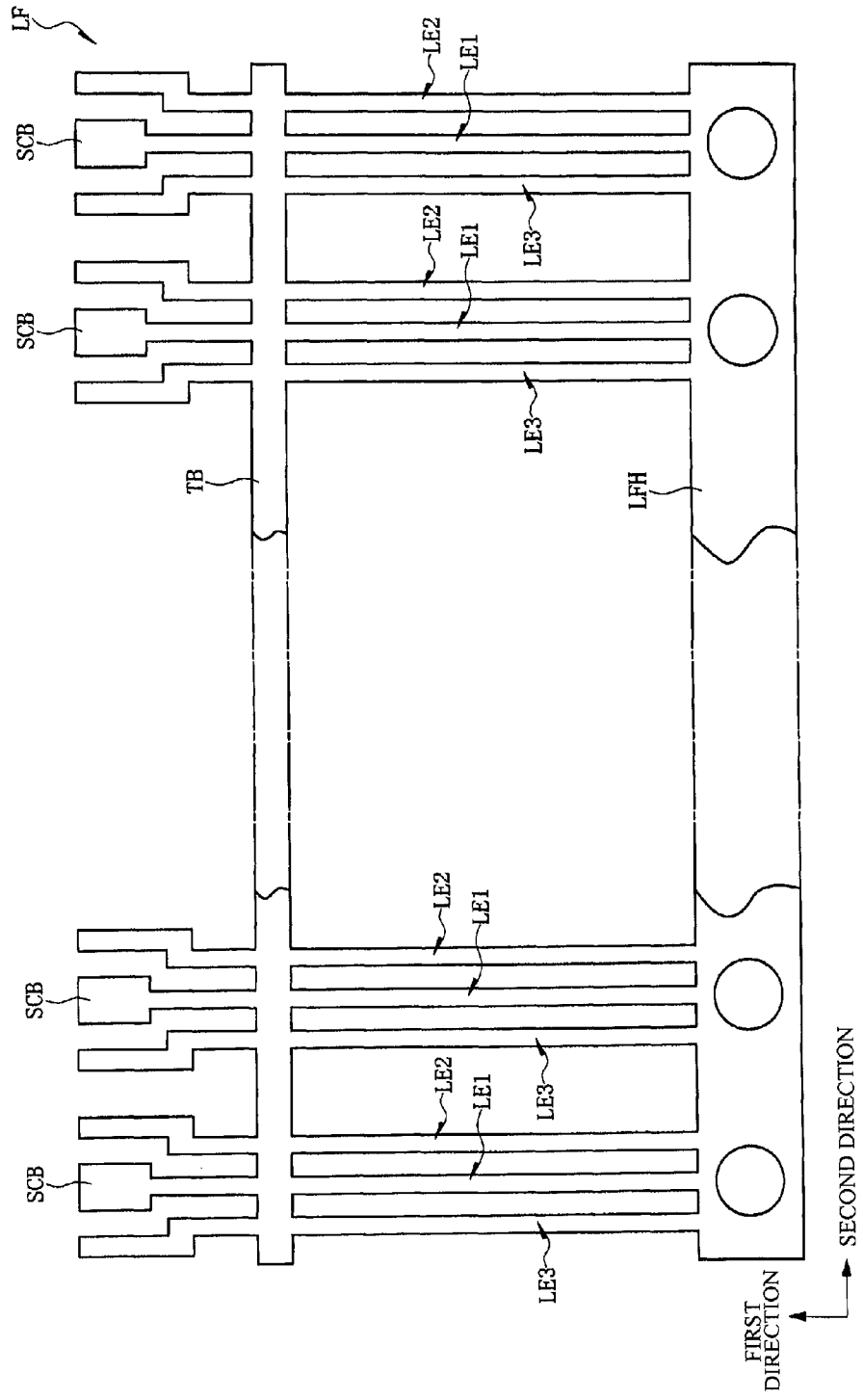
FIG. 5 is a principle part plan view showing an example of an external form of a lead frame according to the first embodiment.
Figure 6A:
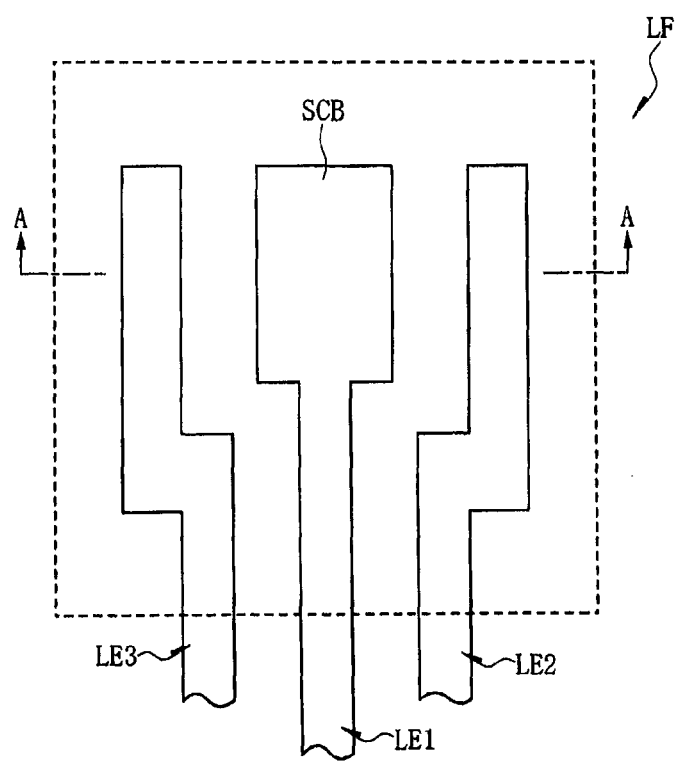
FIG. 6A is a principle part plan view (front view) showing an enlarged part of the semiconductor device in a lead frame plating step according to the first embodiment.
Figure 6B:
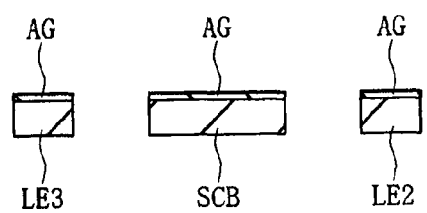
FIG. 6B is a principle part cross-sectional view taken along a line A-A in FIG. 6A.
Figure 7A:
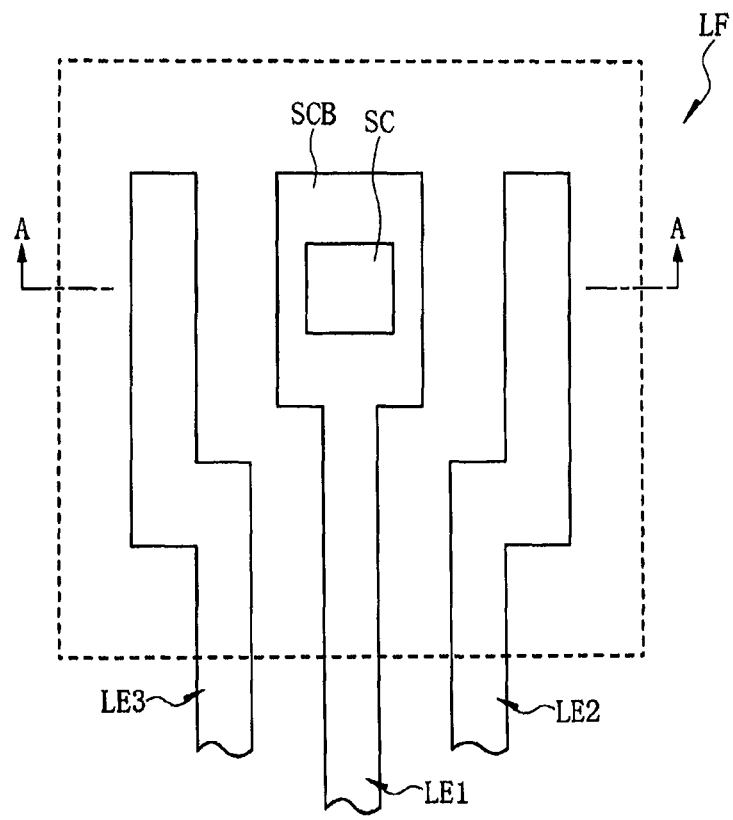
FIG. 7A is a principle part plan view (front view) showing an enlarged part of the semiconductor device in a chip mounting step according to the first embodiment.
Figure 7B:
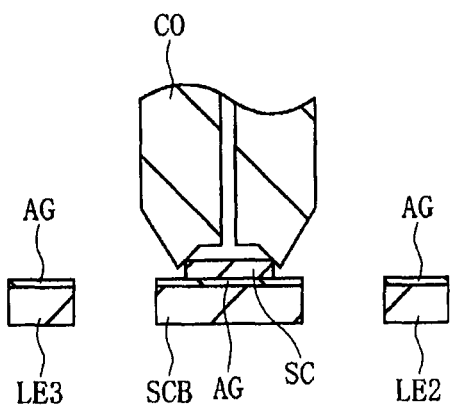
FIG. 7B is a principle part cross-sectional view taken along a line A-A in FIG. 7A.
Figure 8A:
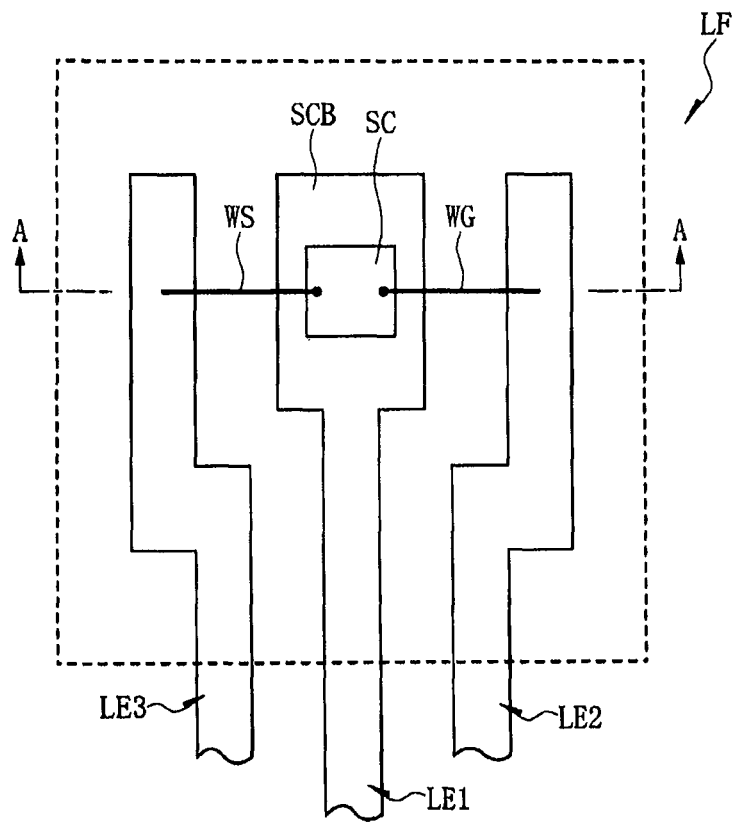
FIG. 8A is a principle part plan view (front view) showing an enlarged part of the semiconductor device in a wire bonding step according to the first embodiment.
Figure 8B:
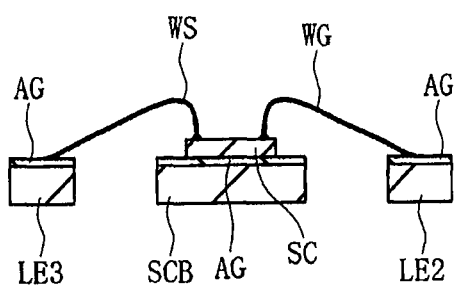
FIG. 8B is a principle part cross-sectional view taken along a line A-A in FIG. 8A.

FIG. 4 is a step diagram of the manufacturing method of the semiconductor device. FIG. 5 is a principle part plan view showing an example of an external form of a lead frame. FIG. 6A is a principle part plan view showing an enlarged part of the semiconductor device in a lead frame plating step, and FIG. 6B is a principle part cross-sectional view taken along a line A-A in FIG. 6A. FIG. 7A is a principle part plan view showing an enlarged part of the semiconductor device in a chip mounting step, and FIG. 7B is a principle part cross-sectional view taken along a line A-A in FIG. 7A. FIG. 8A is a principle part plan view showing an enlarged part of the semiconductor device in a wire bonding step, and FIG. 8B is a principle part cross-sectional view taken along a line A-A in FIG. 8A. Meanwhile, FIGS. 6A, 7A, and 8A show only an area corresponding to a resin sealing portion of one unit frame.

Figure 9A:
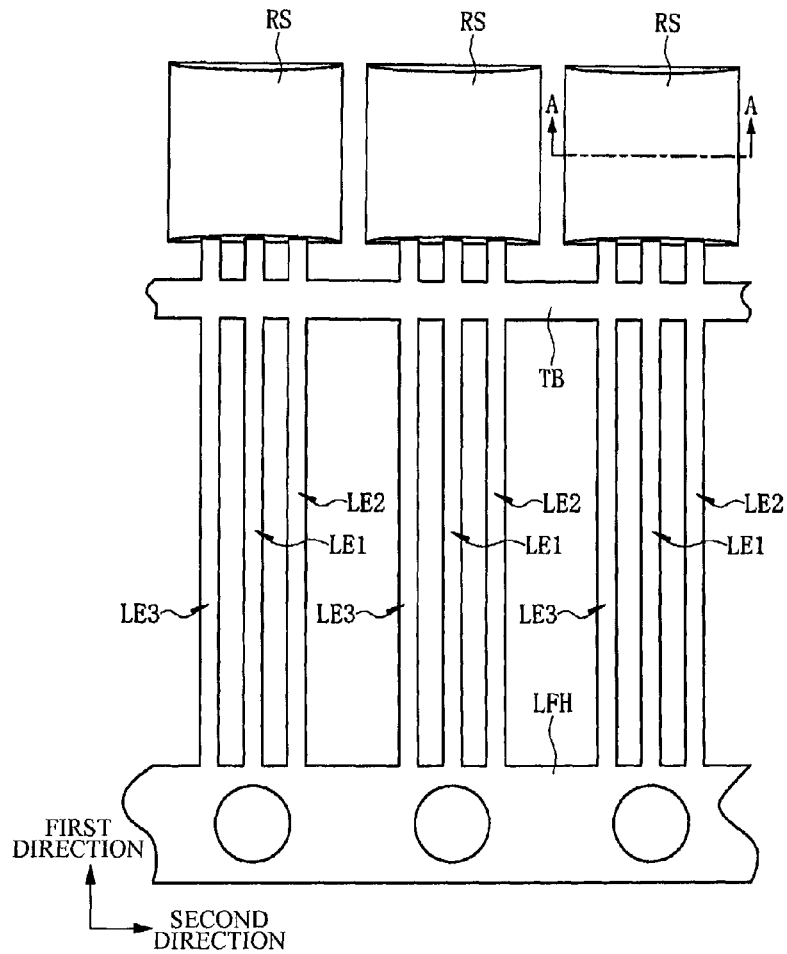
FIG. 9A is a principle part plan view (front view) of the semiconductor device in a molding step according to the first embodiment.
Figure 9B:
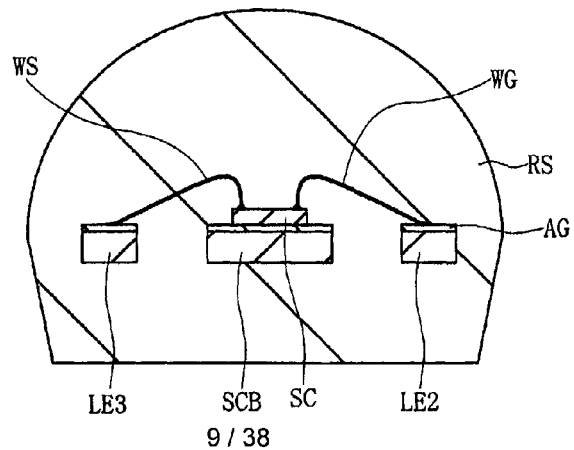
FIG. 9B is a principle part cross-sectional view taken along a line A-A in FIG. 9A.
Figure 11:
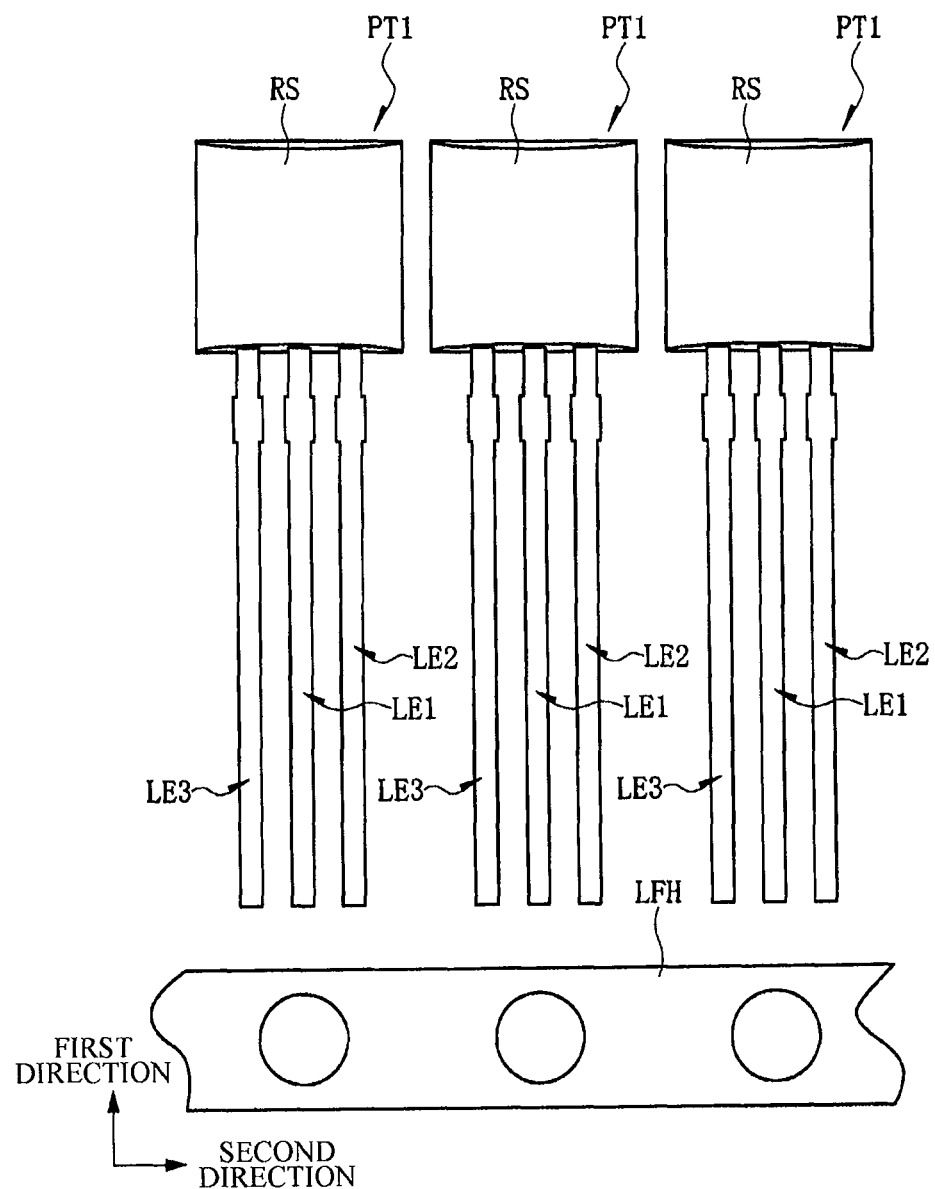
FIG. 11 is a principle part plan view (front view) of the semiconductor device in a lead cutting step according to the first embodiment.
Figure 12:
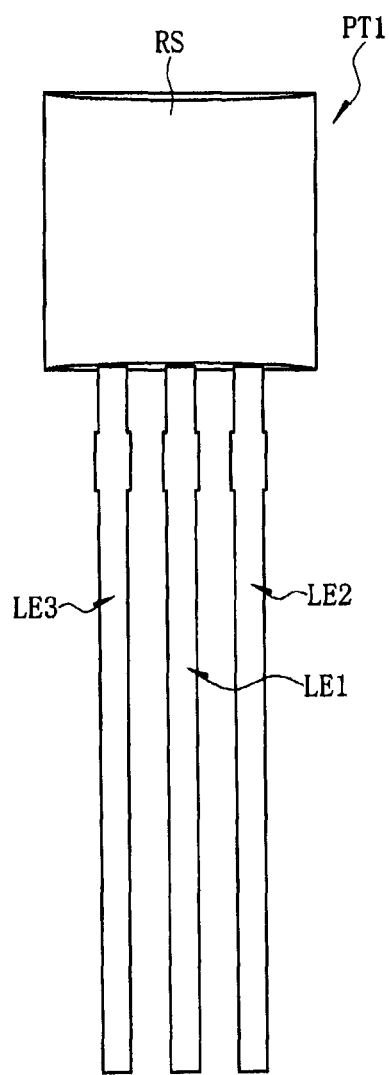
FIG. 12 is a principle part plan view (front view) of the semiconductor device in a lead plating step according to the first embodiment.
Figure 13:
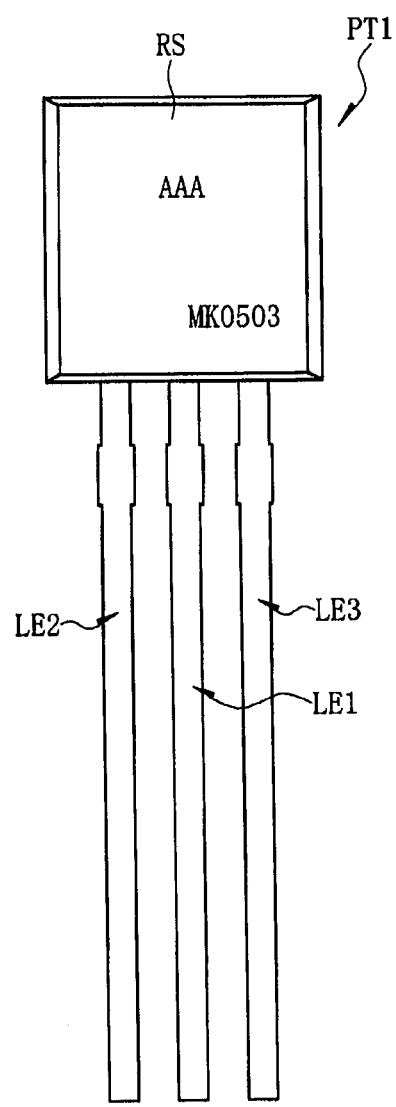
FIG. 13 is a principle part plan view (rear view) of the semiconductor device in a marking step according to the first embodiment.

FIG. 9A is a principle part plan view of the semiconductor device in a molding step, and FIG. 9B is a principle part cross-sectional view taken along a line A-A in FIG. 9A. FIG. 10 is a principle part plan view of the semiconductor device in a tie bar cutting step. FIG. 11 is a principle part plan view of the semiconductor device in a lead cutting step. FIG. 12 is a principle part plan view of the semiconductor device in a lead plating step. FIG. 13 is a principle part plan view of the semiconductor device in a marking step.

Figure 14:
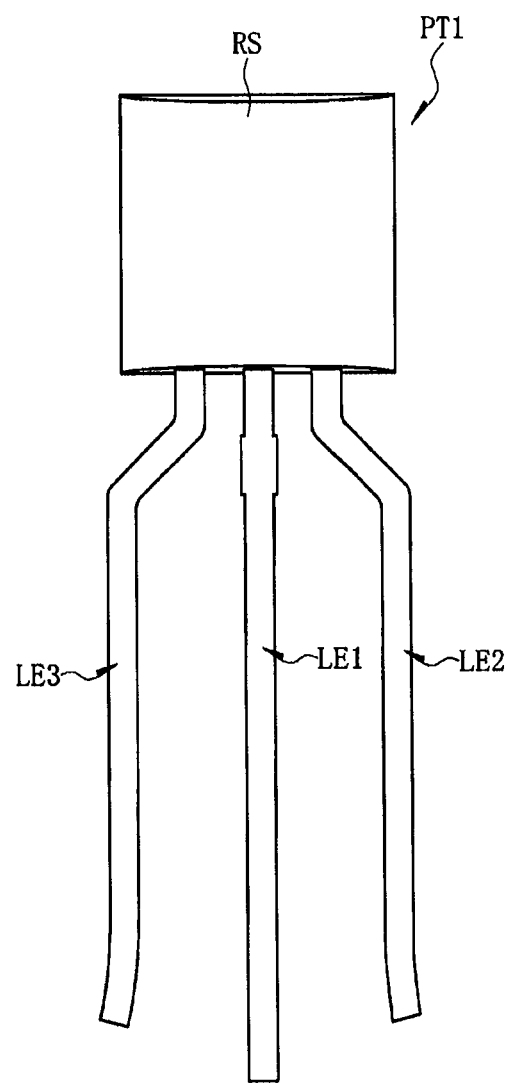
FIG. 14 is a principle part plan view (front view) of the semiconductor device in a lead bending step according to the first embodiment.
Figure 15:
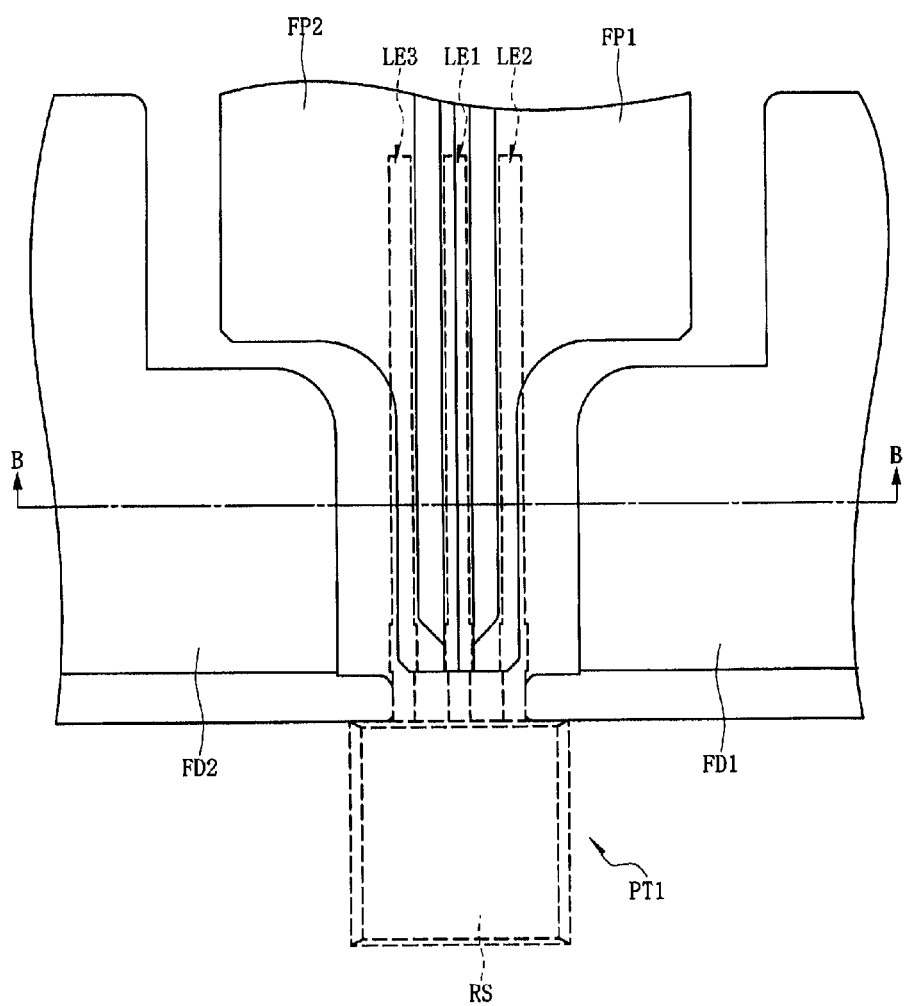
FIG. 15 is a principle part plan view showing a molding die and the semiconductor device before processing in the lead bending step according to the first embodiment.
Figure 17:
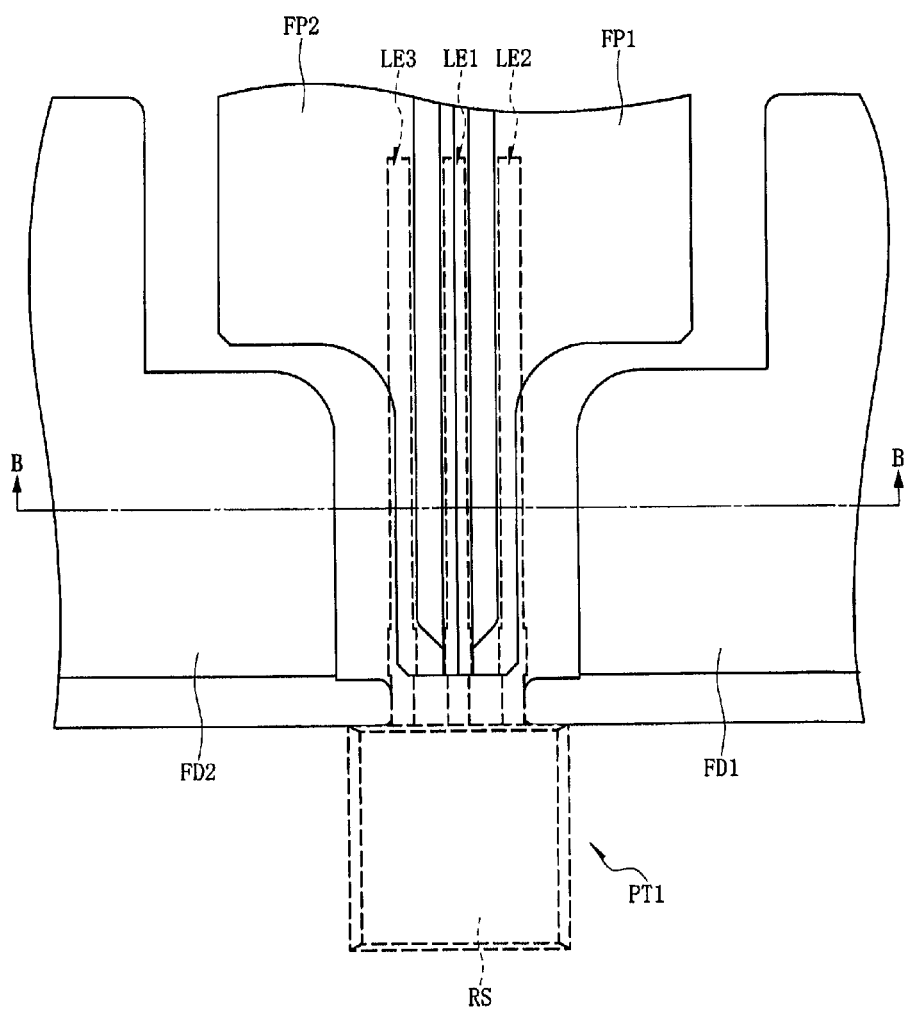
FIG. 17 is a principle part plan view showing the molding die and the semiconductor device during the processing in the lead bending step according to the first embodiment.
Figure 18:
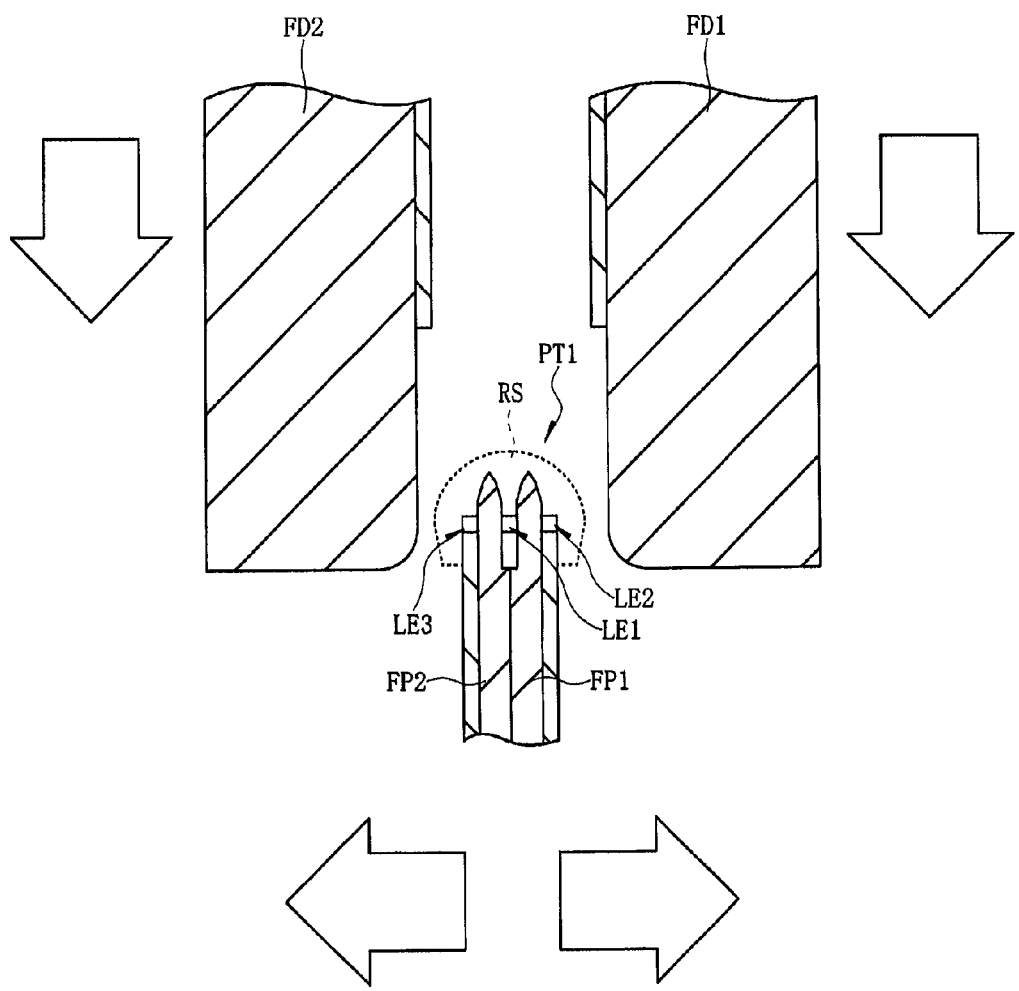
FIG. 18 is a principle part cross-sectional view (a principle part cross-sectional view taken along a line B-B in FIG. 17) showing the molding die and the semiconductor device during the processing in the lead bending step according to the first embodiment.
Figure 19:
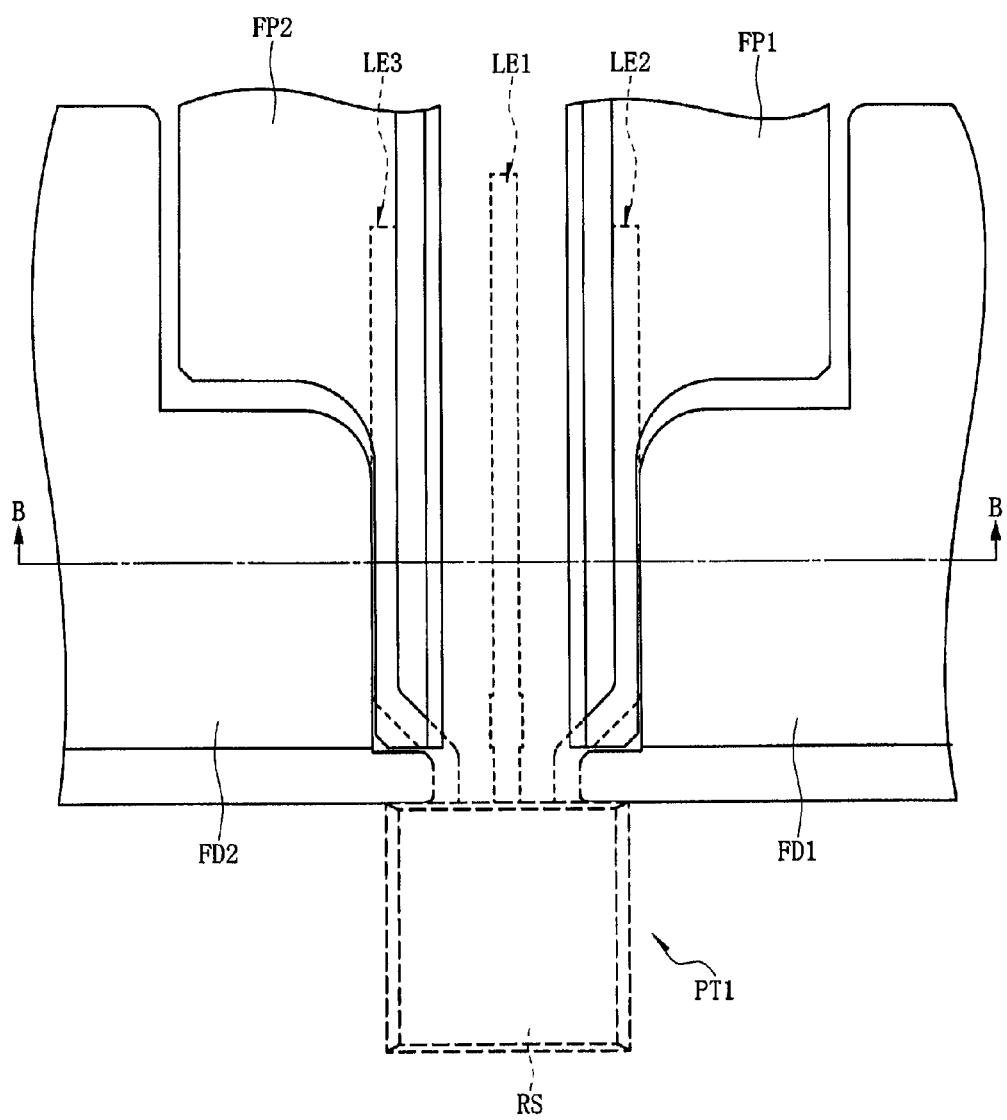
FIG. 19 is a principle part plan view showing the molding die and the semiconductor device after the processing in the lead bending step according to the first embodiment.
Figure 20:
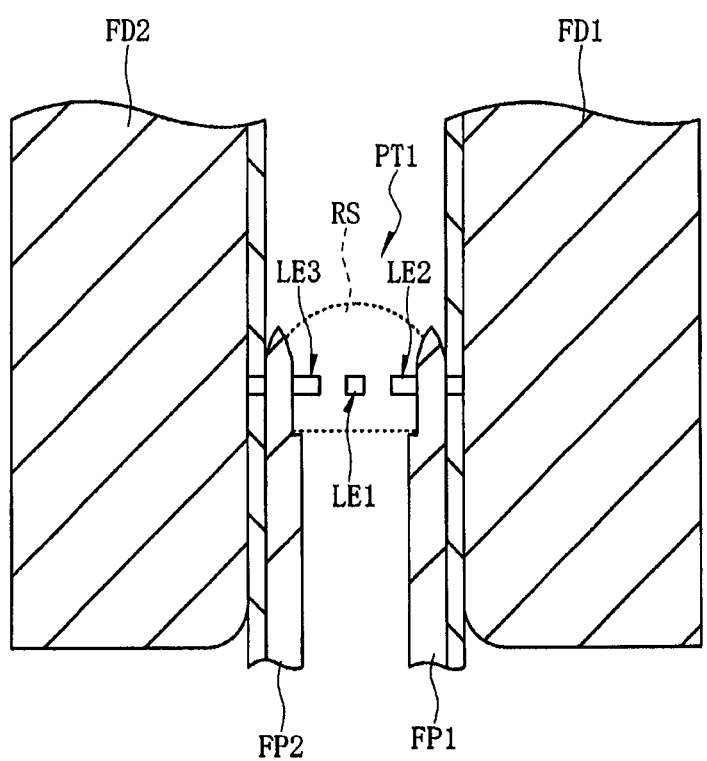
FIG. 20 is a principle part cross-sectional view (a principle part cross-sectional view taken along a line B-B in FIG. 19) showing the molding die and the semiconductor device after the processing in the lead bending step according to the first embodiment.

FIG. 14 is a principle part plan view of the semiconductor device in a lead bending step. FIG. 15 is a principle part plan view showing a molding die and the semiconductor device before processing in the lead bending step, and FIG. 16 is a principle part cross-sectional view (a principle part cross-sectional view taken along a line B-B in FIG. 15) showing the molding die and the semiconductor device before the processing in the lead bending step. FIG. 17 is a principle part plan view showing the molding die and the semiconductor device during the processing in the lead bending step, and FIG. 18 is a principle part cross-sectional view (a principle part cross-sectional view taken along a line B-B in FIG. 17) showing the molding die and the semiconductor device during the processing in the lead bending step. FIG. 19 is a principle part plan view showing the molding die and the semiconductor device after the processing in the lead bending step, and FIG. 20 is a principle part cross-sectional view (a principle part cross-sectional view taken along a line B-B in FIG. 19) showing the molding die and the semiconductor device after the processing in the lead bending step.

Figure 21:
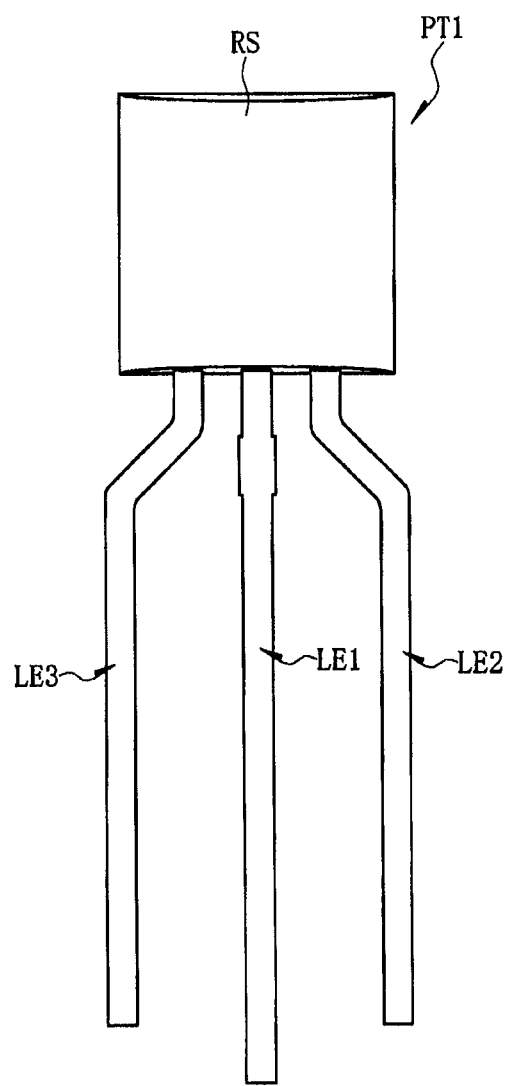
FIG. 21 is a principle part plan view (front view) of the semiconductor device in a lead tip alignment step according to the first embodiment.
Figure 22:
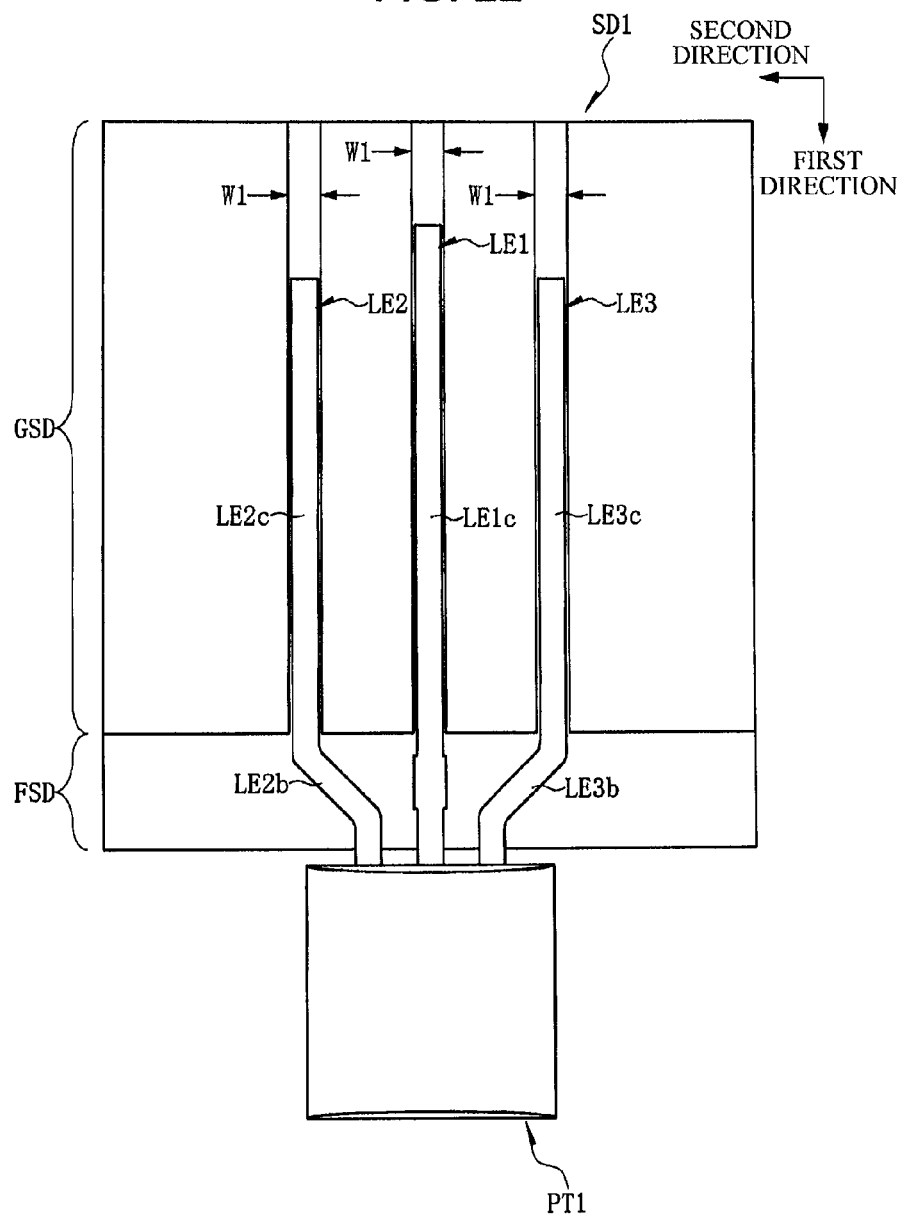
FIG. 22 is a principle part plan view showing a lower die of a spanking die and the semiconductor device in the lead tip alignment step according to the first embodiment.
Figure 23:
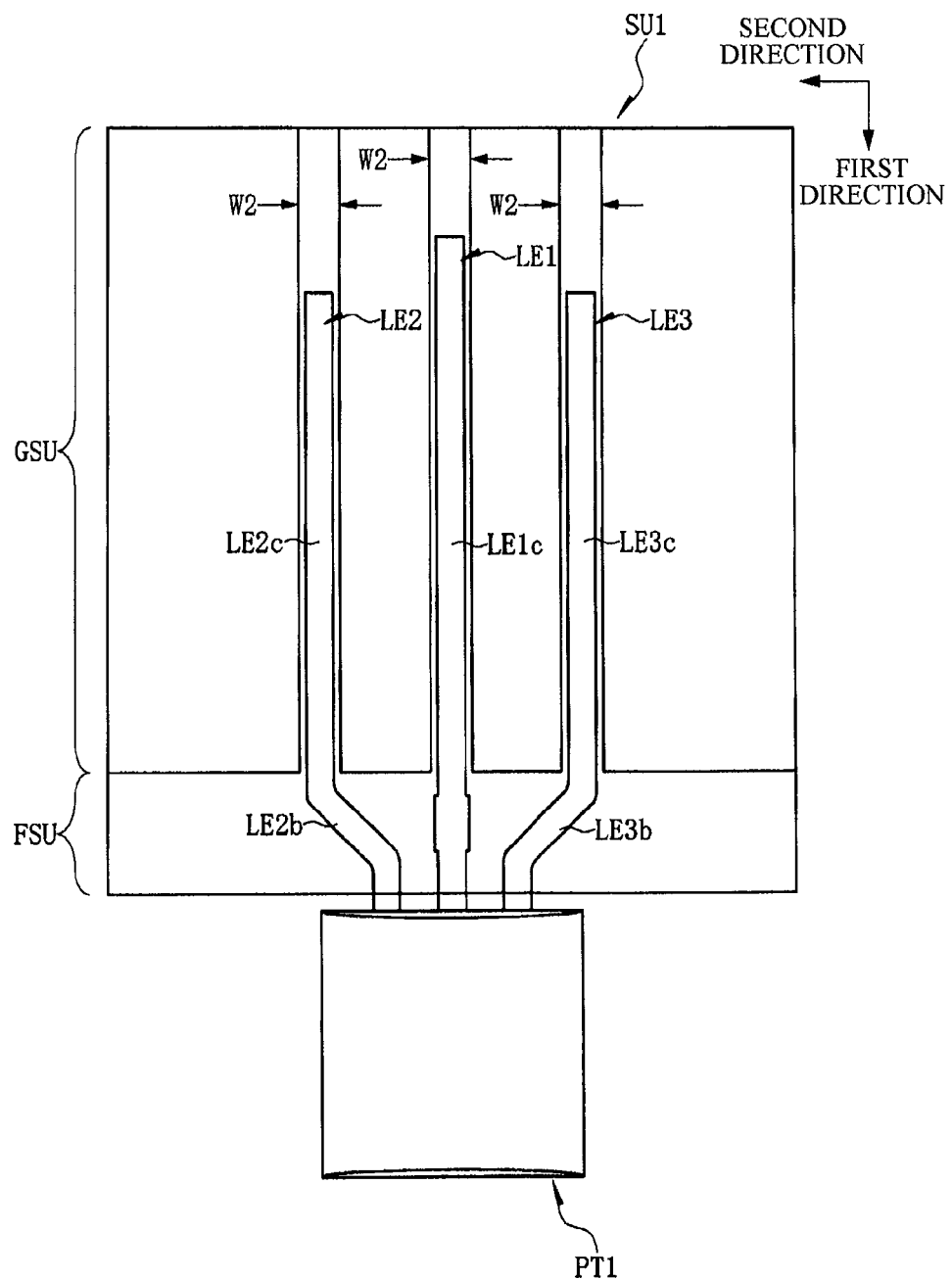
FIG. 23 is a principle part plan view showing an upper die of the spanking die and the semiconductor device in the lead tip alignment step according to the first embodiment as seen through the upper die.
Figure 24:
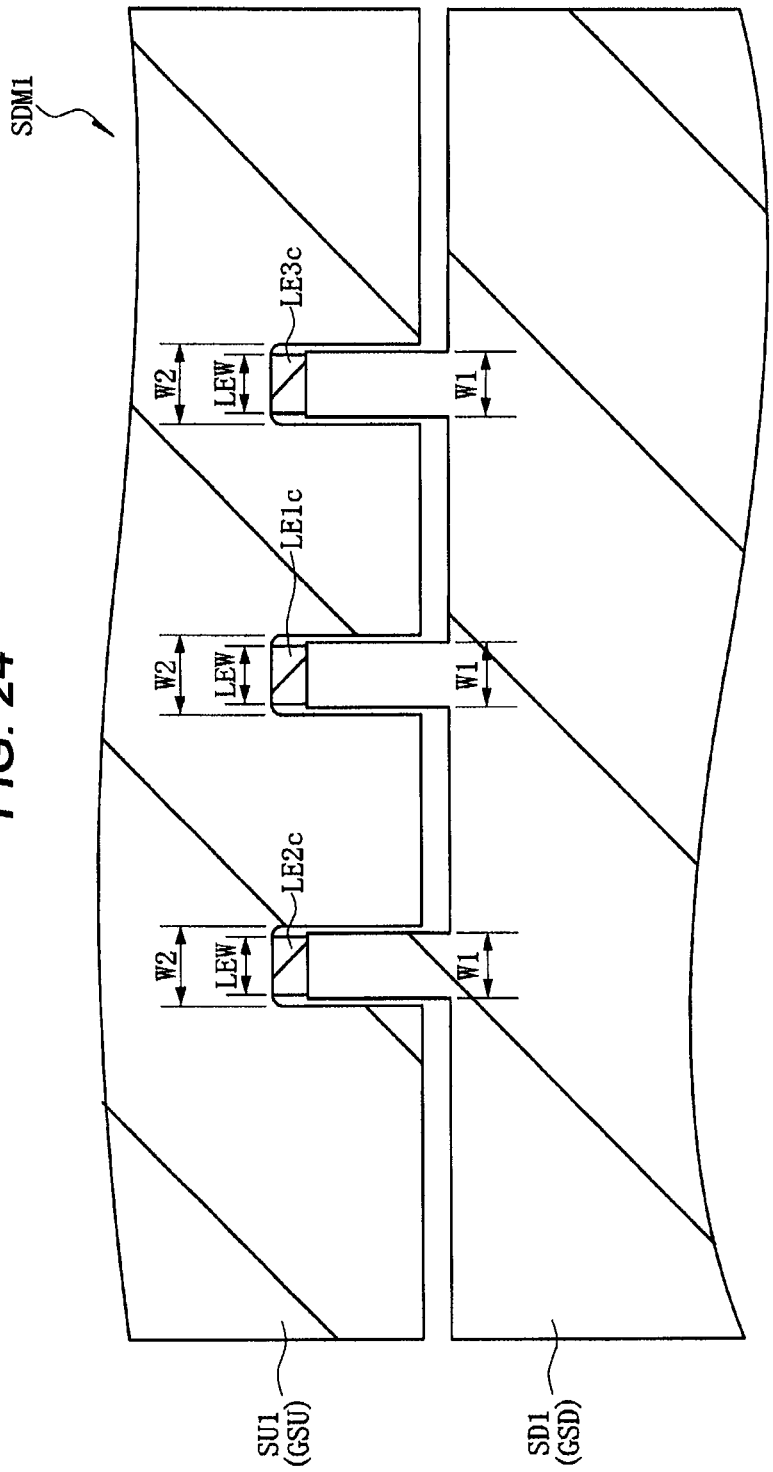
FIG. 24 is a principle part cross-sectional view showing tip portions of the leads pressed by the spanking die in the lead tip alignment step according to the first embodiment.
Figure 25:
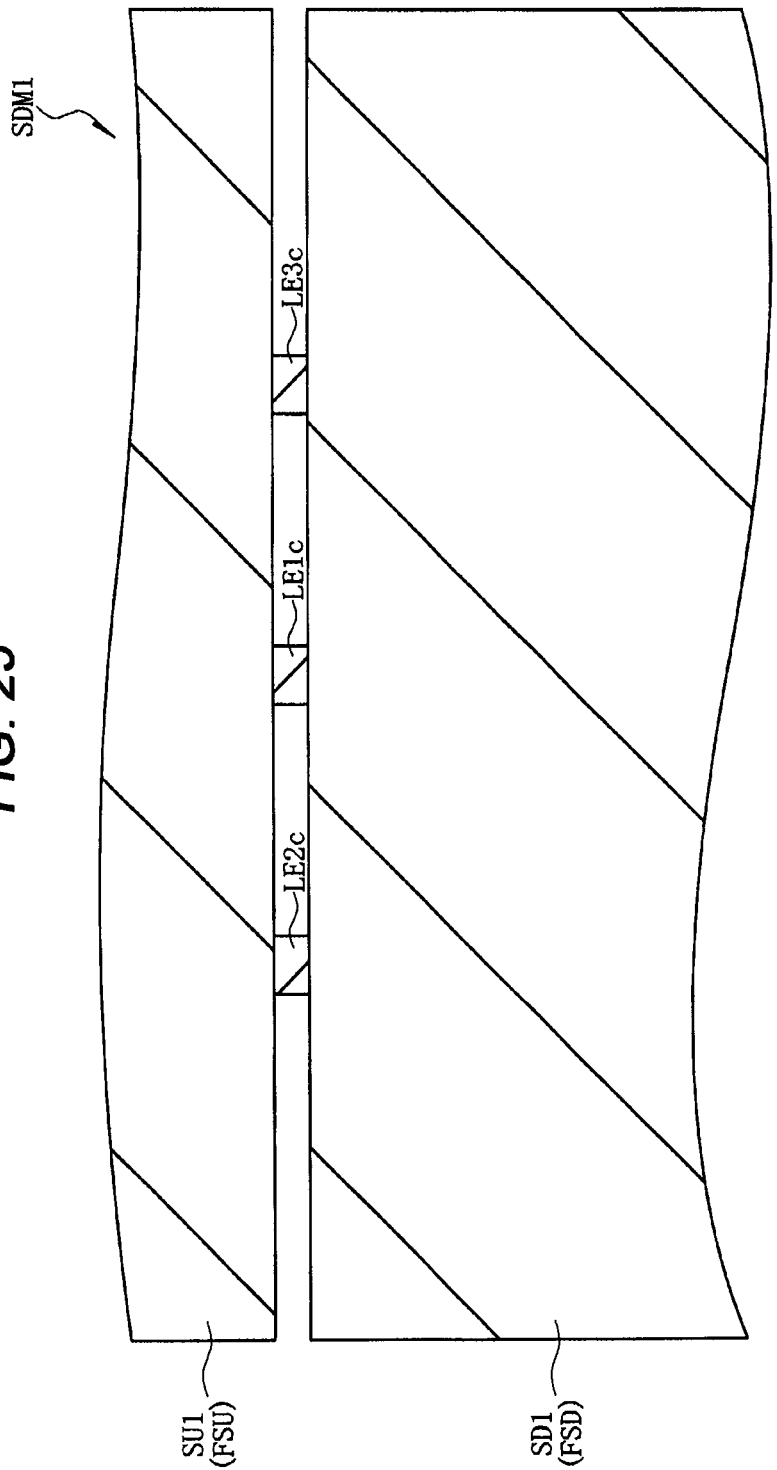
FIG. 25 is a principle part cross-sectional view showing bent portions of the leads pressed by the spanking die in the lead tip alignment step according to the first embodiment.
Figure 26:
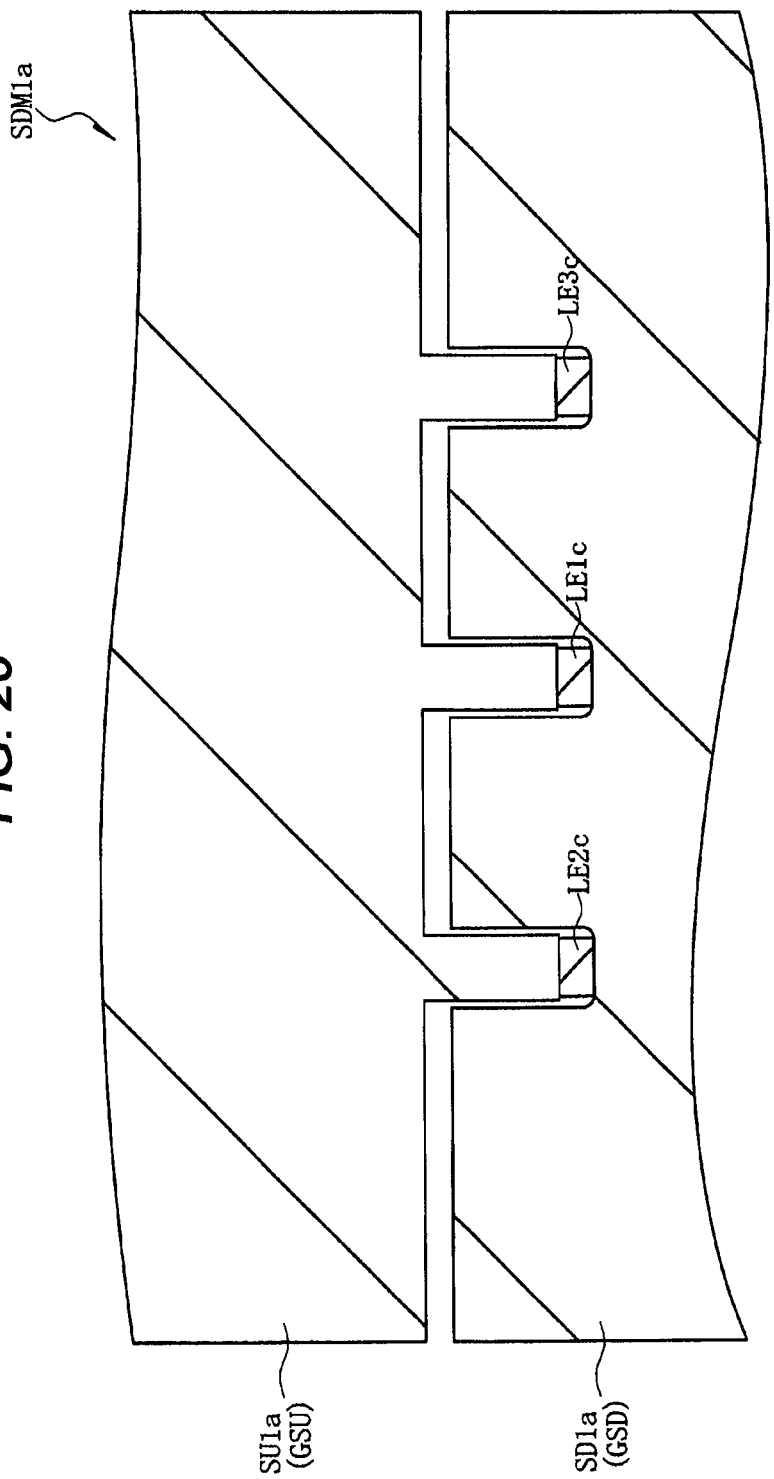
FIG. 26 is a principle part cross-sectional view showing another example of the bent portions of the leads pressed by the spanking die in the lead tip alignment step according to the first embodiment.

FIG. 21 is a principle part plan view of the semiconductor device in a lead tip alignment step. FIG. 22 is a principle part plan view showing a lower die of a spanking die and the semiconductor device in the lead tip alignment step. FIG. 23 is a principle part plan view showing an upper die of the spanking die and the semiconductor device in the lead tip alignment step as seen through the upper die. FIG. 24 is a principle part cross-sectional view showing tip portions of the respective leads pressed by the spanking die in the lead tip alignment step. FIG. 25 is a principle part cross-sectional view showing bent portions of the respective leads pressed by the spanking die in the lead tip alignment step. FIG. 26 is a principle part cross-sectional view showing another example of the bent portions of the respective leads pressed by the spanking die in the lead tip alignment step.

<Semiconductor Chip Provision Step>

A plurality of power MOSFETs is formed on a circuit forming surface (a surface). The power MOSFETs are formed on a semiconductor wafer for each chip according to a predetermined manufacturing process in a manufacturing process referred to as a front-end process or a diffusion process. Subsequently, whether the semiconductor chips formed on the semiconductor wafer are defective or non-defective is determined for each semiconductor chip, and then the semiconductor wafer is diced and singulated into respective semiconductor chips.

The semiconductor chip has a surface and a back surface opposite to the surface. A bonding pad (an electrode pad or a surface electrode) electrically coupled to the gate of the power MOSFET and a bonding pad (an electrode pad or a surface electrode) electrically coupled to the source of the power MOSFET are formed on the surface of the semiconductor chip. The bonding pad formed on the surface of the semiconductor chip is formed of a metal film, for example, aluminum (Al) and exposed by an opening portion formed in a surface protective film. A back surface electrode electrically coupled to the drain of the power MOSFET is formed on the back surface of the semiconductor chip.

<Lead Frame Provision Step>

As shown in FIG. 5, a lead frame (a wiring member) LF, which is a metal frame having a first surface and a second surface opposite to the first surface, is provided. The lead frame LF is formed of a conductive member such as a copper (Cu) alloy. The lead frame has a configuration in which a plurality of unit frames, each of which corresponds to one semiconductor device, is arranged in a second direction indicated in FIG. 5. Each unit frame includes the first lead LE1, the second lead LE2, and the third lead LE3, which are spaced apart from each other and extend in a first direction perpendicular to the second direction, and a chip mounting portion SCB. The cross-sectional shape of the first lead LE1, the second lead LE2, and the third lead LE3 is rectangular. For example, the length of a side of the cross-section on the front surface (first surface) and the rear surface (second surface) (the lead width LEW mentioned above) is 0.5 mm and the length of the other side on the side surface perpendicular to the above side (the lead thickness LET mentioned above) is 0.4 mm.

All of one end portions of a plurality of unit frames in the first direction are coupled to and held by a holding portion LFH. Therefore, one end of the first lead LE1, one end of the second lead LE2, and one end of the third lead LE3 are coupled to and held by the holding portion LFH. A tie bar TB, which couples to and holds the first lead LE1, the second lead LE2, and the third lead LE3, is formed between one end portions of the unit frames in the first direction and the other end portions.

The other end portions of the unit frames in the first direction are portions to be a main body in which the semiconductor chip is mounted in a later step and a resin sealing body is formed. The other end portions of the unit frames in the first direction are separated from each other and the other end of the first lead LE1 is coupled to the chip mounting portion SCB on which the semiconductor chip is mounted in a later step. In a portion to be the main body of each unit frame, the second lead LE2 and the third lead LE3 are arranged to be apart from each other and the chip mounting portion SCB and the first lead LE1 coupled to the chip mounting portion SCB are arranged between the second lead LE2 and the third lead LE3 to be apart from the second lead LE2 and the third lead LE3.

<Lead Frame Plating Step>

As shown in FIGS. 6A and 6B, a plating process is performed on the lead frame LF. Because of this, for example, a plating film AG of silver (Ag) is formed on a first surface of the lead frame LF.

<Chip Mounting Step>

As shown in FIGS. 7A and 7B, a semiconductor chip SC is conveyed by a collet CO and mounted over a first surface of the chip mounting portion SCB of each unit frame by causing the first surface of the first lead LE1 and a back surface of the semiconductor chip SC to face each other. The first surface of the chip mounting portion SCB and the back surface of the semiconductor chip SC are bonded together by, for example, gold-tin (Au—Sn) eutectic bonding. Because of this, the drain of the power MOSFET formed on the semiconductor chip SC and the first lead LE1 are electrically coupled together via the back surface electrode. Although here, a method for bonding together the first surface of the chip mounting portion SCB and the back surface of the semiconductor chip SC by gold-tin (Au—Sn) eutectic bonding is described, the method is not limited to this. The coupling of the surface of the chip mounting portion SCB and the back surface of the semiconductor chip SC may be performed by using other conductive adhesive (solder or silver (Ag) paste).

<Wire Bonding Step>

As shown in FIGS. 8A and 8B, a bonding pad (not shown in the drawings) which is formed on the surface of the semiconductor chip SC by, for example, a nail head bonding (ball bonding) method, in which thermocompression bonding and ultrasonic vibration are used in combination, and electrically couples to the gate of the power MOSFET and the first surface of the second lead LE2 of a portion to be the main body are electrically coupled together via a conductive member, for example, a wire WG. Because of this, the gate of the power MOSFET and the second lead LE2 are electrically coupled together via the bonding pad and the wire WG.

Similarly, a bonding pad (not shown in the drawings) which is formed on the surface of the semiconductor chip SC and electrically couples to the source of the power MOSFET and the first surface of the third lead LE3 of a portion to be the main body are electrically coupled together via a conductive member, for example, a wire WS. Because of this, the source of the power MOSFET and the third lead LE3 are electrically coupled together via the bonding pad and the wire WS. Metal material such as gold (Au), copper (Cu), and aluminum (Al) is used for the wires WG and WS.

<Molding Step>

As shown in FIGS. 9A and 9B, the lead frame LF in which the semiconductor chips SC are arranged is set in a die molding machine, a sealing resin which is heated and liquefied is pressure-fed and flowed into the die molding machine, the portion to be the main body is sealed by the sealing resin, and one resin sealing body RS is formed. Subsequently, for example, heat treatment (post cure bake) is performed at 175° C. for 5 hours. Because of this, a part of the semiconductor chip SC (top surface and side surfaces), wires WG and WS, the chip mounting portion SCB, a portion to be the main body of the first lead LE1, the second lead LE2, and the third lead LE3, and the like are sealed by the resin sealing body RS. The resin sealing body RS is formed of an epoxy thermosetting insulating resin to which, for example, phenolic hardening agent, silicone rubber, many fillers (for example, silica), and the like are added to reduce stress.

<Tie Bar Cutting Step>

As shown in FIG. 10, the tie bar TB, which is formed between one end portions of the unit frames in the first direction and the other end portions and which couples and holds the first lead LE1, the second lead LE2, and the third lead LE3, is cut off by using a cutting apparatus.

<Lead Cutting Step>

As shown in FIG. 11, the holding portion LFH, which couples and holds one end portions of the unit frames in the first direction, is cut off by using a cutting apparatus and the unit frames are cut into individual semiconductor devices (semiconductor products) PT1. In this case, for example, a cutting punch is moved down to punch the lead frame placed over a die included in the cutting apparatus and the semiconductor devices PT1 are separated from the main body of the lead frame LF.

<Lead Plating Step>

As shown in FIG. 12, a plating process is performed on the first lead LE1, the second lead LE2, and the third lead LE3 which protrude from the resin sealing body RS. Because of this, a plating film (not shown in the drawings) formed of, for example, a tin (Sn) alloy or a tin-lead (Sn—Pb) alloy having a thickness of 10 µm or less is formed on surfaces (front surface, rear surface, side surfaces, and bottom surface) of the first lead LE1, the second lead LE2, and the third lead LE3 which protrude from the resin sealing body RS. Examples of the tin (Sn) alloy include a tin-silver (Sn—Ag) alloy, a tin-copper (Sn—Cu) alloy, and a tin-bismuth (Sn—Bi) alloy. The tin (Sn) alloy may be pure tin (Sn).

<Marking Step>

As shown in FIG. 13, a product name or the like is printed on the rear surface of the resin sealing body RS by using laser, ink, or the like.

<Lead Bending (Forming) Step>

As shown in FIG. 14, the second lead LE2 and the third lead LE3, which protrude from the resin sealing body RS, are processed into a predetermined shape by using a molding die.

First, a state before processing will be described with reference to FIGS. 15 and 16. In FIGS. 15 and 16, the semiconductor device PT1 is represented by dashed lines.

The molding die includes a bending die and a bending punch including different dies. The bending die includes a first bending die FD1 and a second bending die FD2. A pitch between the first bending die FD1 and the second bending die FD2 is set so that a desired pitch between the tip portion LE2c of the second lead LE2 and the tip portion LE3c of the third lead LE3 can be obtained after the forming. The bending punch includes a first bending punch FP1 and a second bending punch FP2.

The semiconductor device PT1 is placed in the molding die so that the first lead LE1, the second lead LE2, and the third lead LE3 are located between the bending die and the bending punch. At this time, the semiconductor device PT1 is placed so that a direction in which the first lead LE1, the second lead LE2, and the third lead LE3 of the semiconductor PT1 are aligned is perpendicular to a direction in which the bending die and the bending punch face each other.

Next, a state during the processing will be described with reference to FIGS. 17 and 18. In FIGS. 17 and 18, the semiconductor device PT1 is represented by dashed lines.

A tip portion of the first bending punch FP1 is inserted between the first lead LE1 and the second lead LE2 and a tip portion of the second bending punch FP2 is inserted between the first lead LE1 and the third lead LE3. Furthermore, the first bending die FD1 and the second bending die FD2 are moved to both sides of the semiconductor device PT1 (both sides in a direction in which the first lead LE1, the second lead LE2, and the third lead LE3 are aligned).

Next, a state after the processing will be described with reference to FIGS. 19 and 20. In FIGS. 19 and 20, the semiconductor device PT1 is represented by dashed lines.

The first bending punch FP1 is moved in a direction spaced apart from the first lead LE1. At the same time, the second bending punch FP2 is moved in a direction spaced apart from the first lead LE1, and thus the tip portion LE2c of the second lead LE2 and the tip portion LE3c of the third lead LE3 are forced open. Because of this, the pitch between the tip portion LE1c of the first lead LE1 and the tip portion LE2c of the second lead LE2 and the pitch between the tip portion LE1c of the first lead LE1 and the tip portion LE3c of the third lead LE3 can be a predetermined pitch. At this time, a part of the second lead LE2 is bent and the bent portion LE2b is formed, and at the same time, a part of the third lead LE3 is bent and the bent portion LE3b is formed.

<Lead Tip Alignment (Spanking) Step>

In the tip portion LE2c of the second lead LE2 and the tip portion LE3c of the third lead LE3 after the lead bending step, the tip portion LE2c of the second lead LE2 and the tip portion LE3c of the third lead LE3 may be deformed (may be uneven) by a processing strain generated in the bent portion (the bent portions LE2b and LE3b).

Therefore, in order to align the tip portion LE2c of the second lead LE2 and the tip portion LE3c of the third lead LE3 into a linear shape, the tip portion LE1c of the first lead LE1, the tip portion LE2c of the second lead LE2, and the tip portion LE3c of the third lead LE3 are aligned by using the spanking die. Because of this, as shown in FIG. 21, the semiconductor device PT1 can be obtained in which the pitch between the tip portion LE1c of the first lead LE1 and the tip portion LE2c of the second lead LE2 and the pitch between the tip portion LE1c of the first lead LE1 and the tip portion LE3c of the third lead LE3 are satisfied with respect to a control value (standard).

First, the upper die and the lower die of the spanking die will be described using FIGS. 22 to 25.

The spanking die SDM1 including the lower die (second die) SD1 shown in FIG. 22 and the upper die (first die) SU1 shown in FIG. 23 is used. The semiconductor device PT1 is sandwiched between a pressing surface of the lower die SD1 and a pressing surface of the upper die SU1 and the tip portion LE1c of the first lead LE1, the bent portion LE2b and the tip portion LE2c of the second lead LE2, and the bent portion LE3b and the tip portion LE3c of the third lead LE3 are pressed. Because of this, the tip portion LE1c of the first lead LE1, the tip portion LE2c of the second lead LE2, and the tip portion LE3c of the third lead LE3 are aligned.

As shown in FIGS. 22, 23, and 24, a pressing surface of a lower die guide portion (second guide portion) GSD of the lower die SD1 and a pressing surface of an upper die guide portion (first guide portion) GSU of the upper die SU1, which press the tip portion LE1c of the first lead LE1, the tip portion LE2c of the second lead LE2, and the tip portion LE3c of the third lead LE3, have comb teeth shapes.

Specifically, three protrusion portions (convex portions) extending in the first direction are provided spaced apart from each other on the pressing surface of the lower die guide portion GSD of the lower die SD1. Side walls of the protrusion portions are formed substantially perpendicular to the upper surface of the protrusion portions. Three groove portions (concave portions) extending in the first direction so as to correspond to the three protrusion portions described above and provided on the lower die guide portion GSD of the lower die SD1, are provided spaced apart from each other, in the pressing surface of the upper die guide portion GSU of the upper die SU1. Side walls of the groove portions are formed substantially perpendicular to the bottom surface of the groove portions.

The width W1 of the protrusion portion SD1 is constant, and for example, the width W1 is set to be larger than or equal to the length of a side of a cross-section of the first lead LE1, the second lead LE2, and the third lead LE3 on the front surface (or the rear surface) (the lead width LEW) and smaller than or equal to (lead width LEW+(lead width LEW×0.1)×2). For example, when the lead width LEW is 0.5 mm, the width W1 of the protrusion portion is set to 0.5 mm or more and 0.6(=0.5+(0.5×0.1)×2) mm or less. The width W2 of the groove portion of the upper die SU1 is constant and set to be larger than the width W1 of the protrusion portion of the lower die SD1.

In contrast, as shown in FIGS. 22, 23, and 25, a pressing surface of a lower die fixing portion (second fixing portion) FSD of the lower die SD1 and a pressing surface of an upper die fixing portion (first fixing portion) FSU of the upper die SU1, which press the bent portion LE2b of the second lead LE2 and the bent portion LE3b of the third lead LE3, are flat.

Next, a procedure for lead tip alignment performed using the spanking die shown in FIGS. 22 to 25 described above will be described.

First, the upper surfaces of the three protrusion portions provided on the lower die guide portion GSD of the lower die SD1 are caused to face the rear surface of the tip portion LE1c of the first lead LE1, the rear surface of the tip portion LE2c of the second lead LE2, and the rear surface of the tip portion LE3c of the third lead LE3, respectively. A flat pressing surface provided on the lower die fixing portion FSD of the lower die SD1 is caused to face the rear surface of the bent portion LE2b of the second lead LE2 and the rear surface of the bent portion LE3b of the third lead LE3. Then, the first lead LE1, the second lead LE2, and the third lead LE3 are mounted over the pressing surface of the lower die SD1.

Next, the bottom surfaces of the three groove portions provided in the upper die guide portion GSU of the upper die SU1 are caused to face the front surface of the tip portion LE1c of the first lead LE1, the front surface of the tip portion LE2c of the second lead LE2, and the front surface of the tip portion LE3c of the third lead LE3, respectively. A flat pressing surface provided on the upper die fixing portion FSU of the upper die SU1 is caused to face the front surface of the bent portion LE2b of the second lead LE2 and the front surface of the bent portion LE3b of the third lead LE3. Then, the first lead LE1, the second lead LE2, and the third lead LE3 are pressed.

In this way, when aligning the tip portion LE1c of the first lead LE1, the tip portion LE2c of the second lead LE2, and the tip portion LE3c of the third lead LE3, not only the tip portion LE1c of the first lead LE1, the tip portion LE2c of the second lead LE2, and the tip portion LE3c of the third lead LE3, but also the bent portion LE2b of the second lead LE2 and the bent portion LE3b of the third lead LE3 are pressed. Because of this, the processing strain of the bent portion LE2b of the second lead LE2 and the bent portion LE3b of the third lead LE3, which is considered to be a cause of unevenness of the tip portion LE1c of the first lead LE1, the tip portion LE2c of the second lead LE2, and the tip portion LE3c of the third lead LE3, can be eliminated (or reduced as much as possible or canceled). In other words, the action of pressing the bent portion LE2b of the second lead LE2 and the bent portion LE3b of the third lead LE3 forcibly disperses the processing strain accumulated in the bent portions LE2b and LE3b to the second lead LE2 and the third lead LE3 in order not for the processing strain to affect the tip portion LE2c of the second lead LE2 and the tip portion LE3c of the third lead LE3 as much as possible.

As a result, the tip portions LE1c, LE2c, and LE3c of the first lead LE1, the second lead LE2, and the third lead LE3 can be aligned, and thus it is possible to stabilize the pitch between the tip portion LE1c of the first lead LE1 and the tip portion LE2c of the second lead LE2 and the pitch between the tip portion LE1c of the first lead LE1 and the tip portion LE3c of the third lead LE3.

In the first embodiment described above is used the spanking die SDM1 in which three protrusion portions are provided on the pressing surface of the lower die guide portion GSD of the lower die SD1 and three groove portions are provided in the pressing surface of the upper die guide portion GSU of the upper die SU1 so as to correspond to the three protrusion portions provided on the lower die guide portion GSD of the lower die SD1, but this not limiting.

For example, as shown in FIG. 26, a spanking die SDM1a may be used and in such spanking die SDM1a three groove portions are provided in the pressing surface of the lower die guide portion GSD of the lower die (second die) SD1a and three protrusion portions are provided on the pressing surface of the upper die guide portion GSU of the upper die (first die) SU1a so as to correspond to the three groove portions provided in the lower die guide portion GSD of the lower die SD1a.

In this case, first, the bottom surfaces of the three groove portions provided in the lower die guide portion GSD of the lower die SD1a are caused to face the rear surface of the tip portion LE1c of the first lead LE1, the rear surface of the tip portion LE2c of the second lead LE2, and the rear surface of the tip portion LE3c of the third lead LE3, respectively. A flat pressing surface provided on the lower die fixing portion FSD of the lower die SD1a is caused to face the rear surface of the bent portion LE2b of the second lead LE2 and the rear surface of the bent portion LE3b of the third lead LE3. Then, the first lead LE1, the second lead LE2, and the third lead LE3 are mounted on the pressing surface of the lower die SD1a.

Next, the upper surfaces of the three protrusion portions provided on the upper die guide portion GSU of the upper die SU1a are caused to face the front surface of the tip portion LE1c of the first lead LE1, the front surface of the tip portion LE2c of the second lead LE2, and the front surface of the tip portion LE3c of the third lead LE3, respectively. A flat pressing surface provided on the upper die fixing portion FSU of the upper die SU1a is caused to face the front surface of the bent portion LE2b of the second lead LE2 and the front surface of the bent portion LE3b of the third lead LE3. Then, the first lead LE1, the second lead LE2, and the third lead LE3 are pressed.

As described above, whether the protrusion portions or the groove portions are provided on the pressing surface of the lower die guide portion GSD and the pressing surface of the upper die guide portion GSU is not limited.

When the protrusion portions are provided on the pressing surface of the lower die guide portion GSD of the lower die SD1 and the groove portions are provided in the pressing surface of the upper die guide portion GSU of the upper die SU1 as in the spanking die SDM1, the pressing surface of the lower die guide portion GSD has a protruded shape. Therefore, even if plating dust or foreign objects occur, the plating dust or the foreign objects are difficult to be accumulated on the pressing surface of the lower die guide portion GSD as compared with a case in which the pressing surface of the lower die guide portion GSD has a grooved shape. As a result, when pressing the first lead LE1, the second lead LE2, and the third lead LE3, it is possible to reduce the aforementioned plating dust and foreign objects to be inserted.

When the groove portions are provided in the pressing surface of the lower die guide portion GSD of the lower die SD1a and the protrusion portions are provided on the pressing surface of the upper die guide portion GSU of the upper die SU1a as in the spanking die SDM1a, the pressing surface of the lower die guide portion GSD has a grooved shape. Therefore, when setting the semiconductor device PT1, the first lead LE1, the second lead LE2, and the third lead LE3 can be smoothly set as compared with a case in which the pressing surface of the lower die guide portion GSD has a protruded shape. As a result, it is possible to stably press the first lead LE1, the second lead LE2, and the third lead LE3 by the lower die SD1a and the upper die SU1a.

Furthermore, in the first embodiment described above, the pressing surface of the lower die fixing portion FSD of the lower dies SD1 and SD1a and the pressing surface of the upper die fixing portion FSU of the upper die SU1 and SU1a, which press the bent portion LE2b of the second lead LE2 and the bent portion LE3b of the third lead LE3, have a planar shape, but this is not limiting. For example, the pressing surfaces may have a comb teeth shape in the same manner as the pressing surface of the lower die guide portion GSD of the lower dies SD1 and SD1a and the pressing surface of the upper die guide portion GSU of the upper dies SU1 and SU1a. When the pressing surface of the lower die fixing portion FSD of the lower dies SD1 and SD1a and the pressing surface of the upper die fixing portion FSU of the upper die SU1 and SU1a have a comb teeth shape, it is possible to improve bending accuracy of the bent portion LE2b of the second lead LE2 and the bent portion LE3b of the third lead LE3 in a planar direction.

<Classification Step and Visual Inspection Step>

Next, classification is performed according to a product standard and furthermore a final visual inspection is performed, and then a product (the semiconductor device PT1) is completed.

<Packing Step>

Next, the product (the semiconductor device PT1) is contained in a concave portion that is formed in a carrier tape in advance. Thereafter, for example, the carrier tape is wound on a reel, and the reel is packed in a moisture-proof bag to be shipped.

In this way, according to the first embodiment, the tip portion LE2c of the second lead LE2 and the tip portion LE3c of the third lead LE3 can be aligned into a linear shape. Because of this, it is possible to stabilize the pitch between the tip portion LE1c of the first lead LE1 and the tip portion LE2c of the second lead LE2 and the pitch between the tip portion LE1c of the first lead LE1 and the tip portion LE3c of the third lead LE3.

Second Embodiment

A difference from the first embodiment described above is a shape of the protrusion portions formed on the lower die (or the upper die) and a shape of the groove portions formed in the upper die (or the lower die) in the spanking die used in the lead tip alignment step which is one of manufacturing processes of the semiconductor device. Specifically, in the first embodiment described above, the width of the protrusion portions and the width of the groove portions are constant. In a second embodiment described below, the width of the protrusion portions and the width of the groove portions are not constant and cross-sections of the protrusion portions and the groove portions have a tapered shape.

Although the manufacturing method of the semiconductor device according to the second embodiment will be described below, since the manufacturing steps other than the lead tip alignment step are the same as those in the first embodiment described above, only the lead tip alignment step will be described here.

<<Manufacturing Method of Semiconductor Device>>
<Lead Tip Alignment (Spanking) Step>

Figure 27:
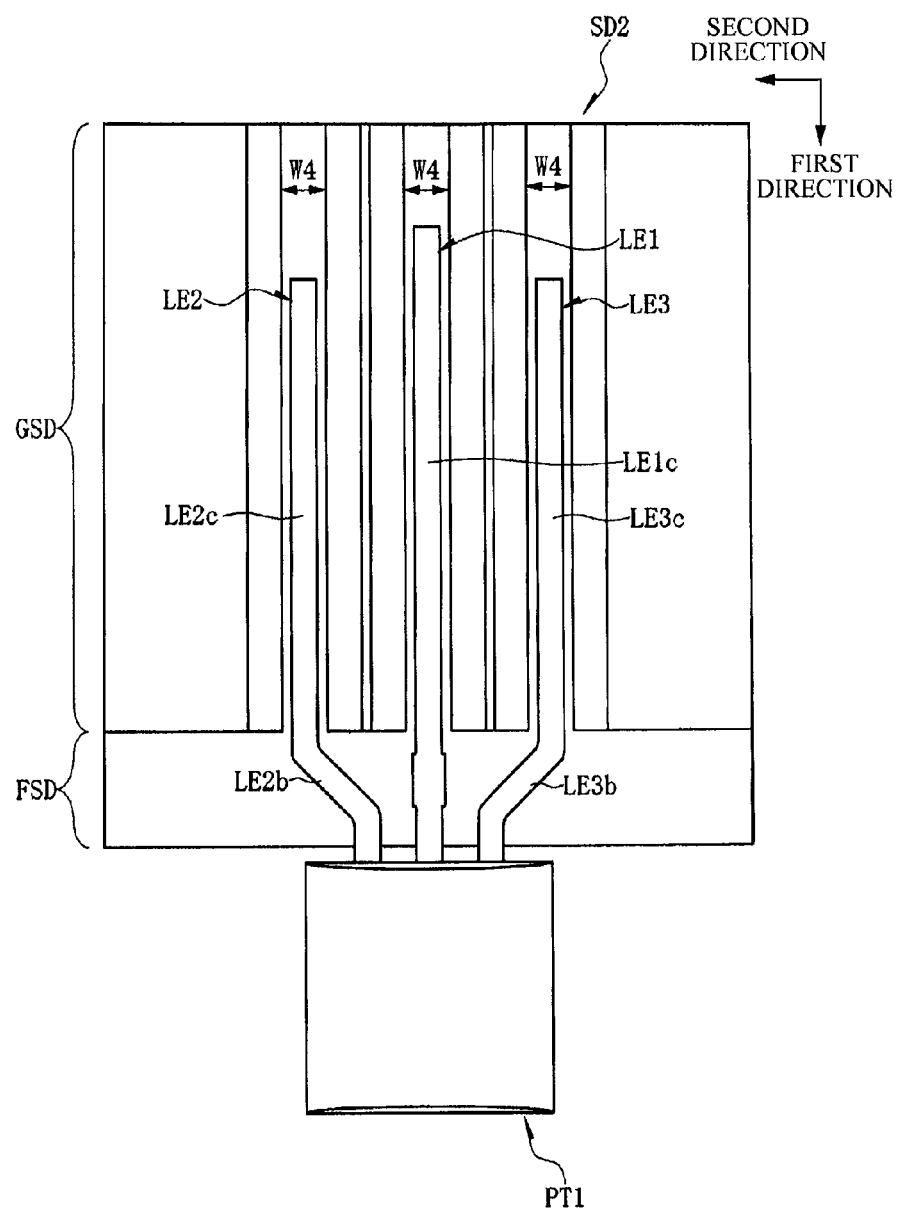
FIG. 27 is a principle part plan view showing a lower die of a spanking die and a semiconductor device in a lead tip alignment step according to a second embodiment.
Figure 28:
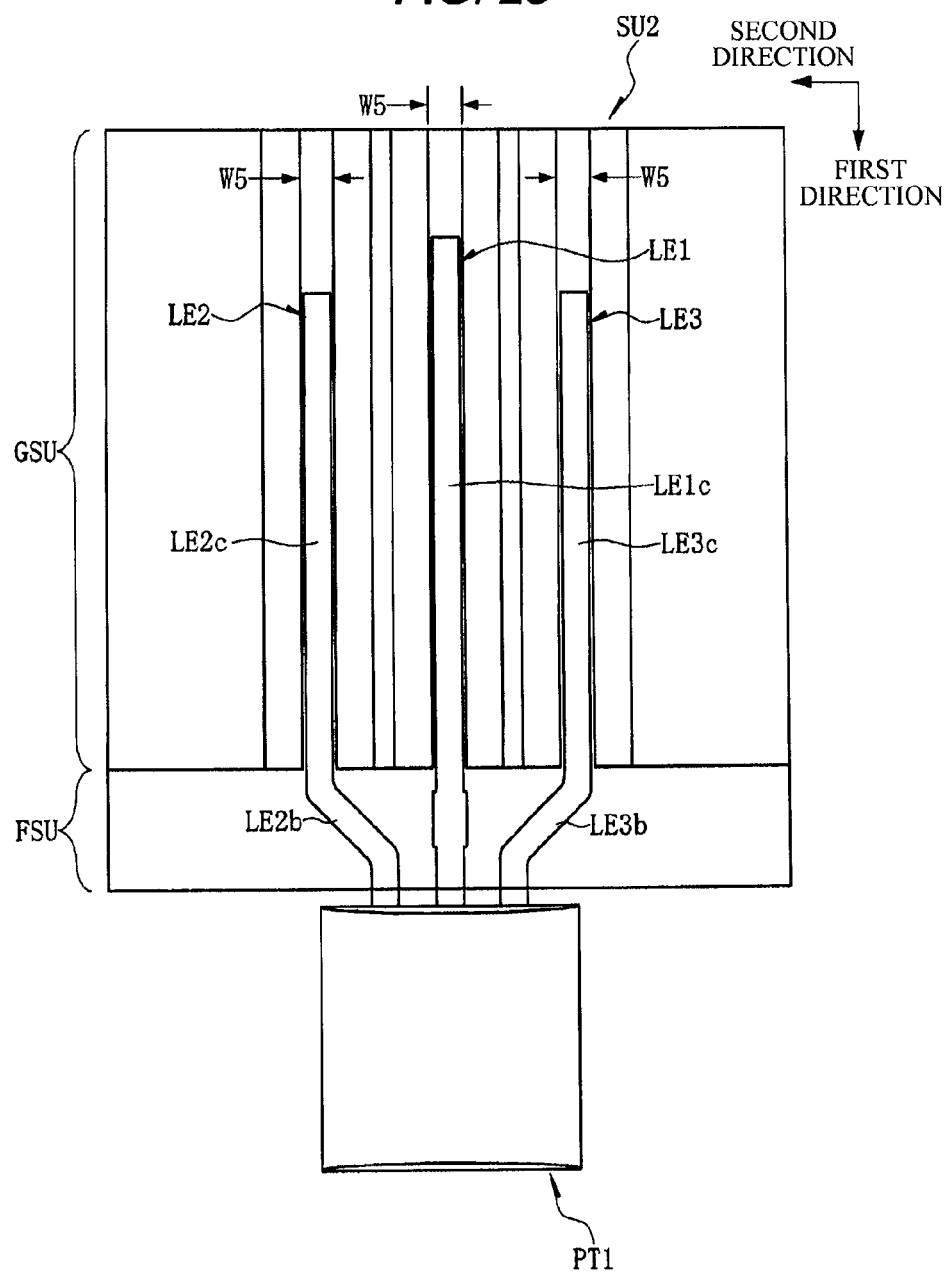
FIG. 28 is a principle part plan view showing an upper die of the spanking die and the semiconductor device in the lead tip alignment step according to the second embodiment as seen through the upper die.
Figure 29:
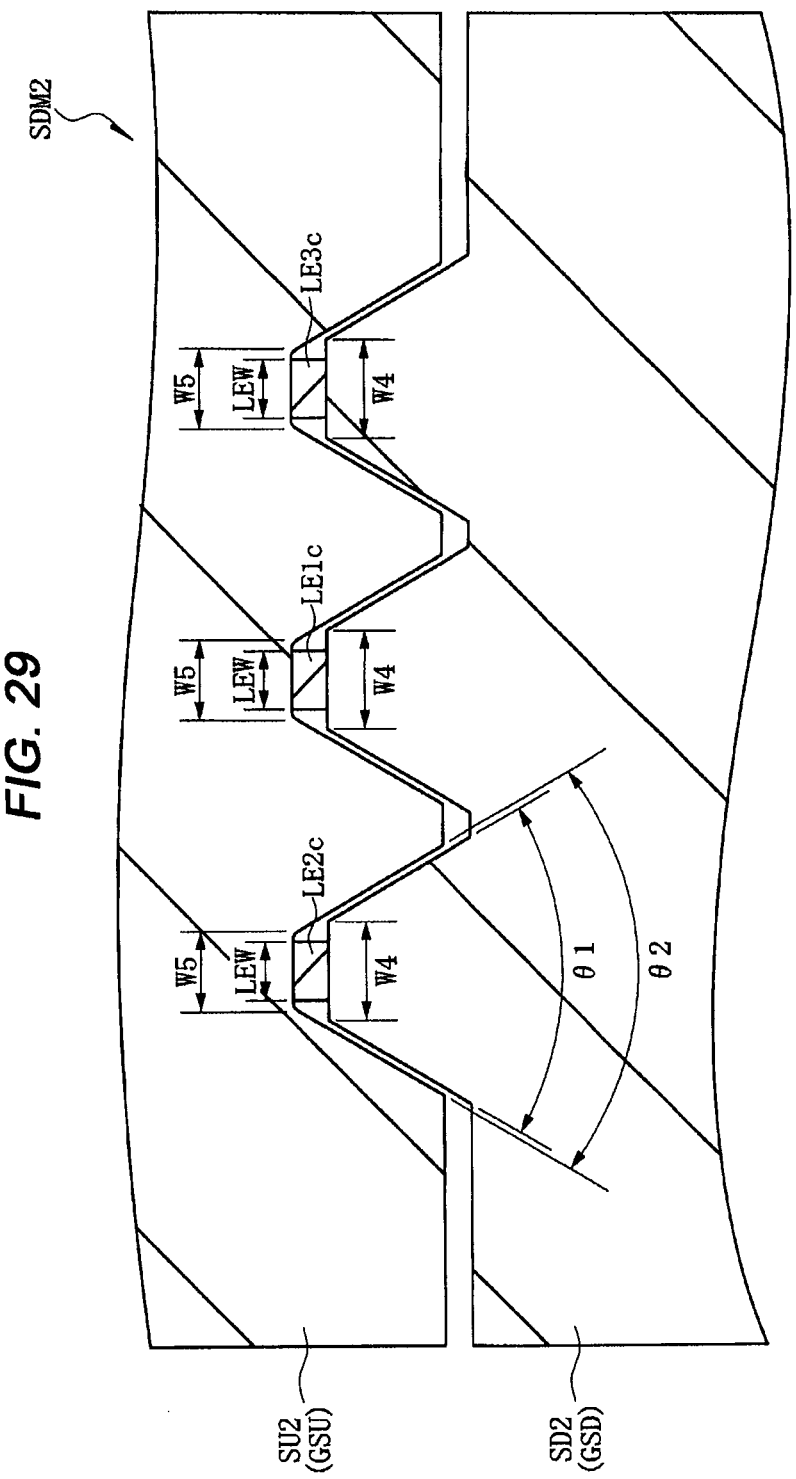
FIG. 29 is a principle part cross-sectional view showing tip portions of leads pressed by the spanking die in the lead tip alignment step according to the second embodiment.

The manufacturing method of the three-terminal semiconductor device according to the second embodiment will be described with reference to FIGS. 27 to 31. FIG. 27 is a principle part plan view showing a lower die of a spanking die and the semiconductor device in the lead tip alignment step. FIG. 28 is a principle part plan view showing an upper die of the spanking die and the semiconductor device in the lead tip alignment step as seen through the upper die. FIG. 29 is a principle part cross-sectional view showing tip portions of the leads pressed by the spanking die in the lead tip alignment step. FIG. 30 is a principle part cross-sectional view showing bent portions of the leads pressed by the spanking die in the lead tip alignment step. FIG. 31 is a principle part cross-sectional view showing another example of the bent portions of the leads pressed by the spanking die in the lead tip alignment step.

As described above, in the tip portion LE2c of the second lead LE2 and the tip portion LE3c of the third lead LE3 after the lead bending step, the tip portion LE2c of the second lead LE2 and the tip portion LE3c of the third lead LE3 may be uneven by an influence of a processing strain generated in the bent portion (the bent portions LE2b and LE3b).

Therefore, to align the tip portion LE2c of the second lead LE2 and the tip portion LE3c of the third lead LE3 into a linear shape, the tip portion LE1c of the first lead LE1, the tip portion LE2c of the second lead LE2, and the tip portion LE3c of the third lead LE3 are aligned by using the spanking die.

First, the upper die and the lower die of the spanking die will be described with reference to FIGS. 27 to 30.

The spanking die SDM2 including the lower die (second die) SD2 shown in FIG. 27 and the upper die (first die) SU2 shown in FIG. 28 is used. The semiconductor device PT1 is sandwiched between a pressing surface of the lower die SD2 and a pressing surface of the upper die SU2 and the tip portion LE1c of the first lead LE1, the bent portion LE2b and the tip portion LE2c of the second lead LE2, and the bent portion LE3b and the tip portion LE3c of the third lead LE3 are pressed. Because of this, the tip portion LE1c of the first lead LE1, the tip portion LE2c of the second lead LE2, and the tip portion LE3c of the third lead LE3 are aligned.

As shown in FIGS. 27, 28, and 29, a pressing surface of a lower die guide portion GSD of the lower die SD2 and a pressing surface of an upper die guide portion GSU of the upper die SU2, which press the tip portion LE1c of the first lead LE1, the tip portion LE2c of the second lead LE2, and the tip portion LE3c of the third lead LE3, have a comb teeth shape.

Specifically, three protrusion portions (convex portions) extending in the first direction are provided spaced apart from each other on the pressing surface of the lower die guide portion GSD of the lower die SD2. Three groove portions (concave portions) extending in the first direction so as to correspond to the three protrusion portions provided on the lower die guide portion GSD of the lower die SD2, are provided spaced apart from each other in the pressing surface of the upper die guide portion GSU of the upper die SU2.

The width of the protrusion portions of the lower die SD2 is not constant and the cross-sections of the protrusion portions have a tapered shape. Although the upper surfaces of the protrusion portions, on which the tip portion LE1c of the first lead LE1, the tip portion LE2c of the second lead LE2, and the tip portion LE3c of the third lead LE3 are placed, are flat, the farther from the upper surfaces of the protrusion portions, the larger the width of the protrusion portions. For example, the width W4 of the upper surfaces of the protrusion portions is set to be larger than or equal to the length of a side of a cross-section of the first lead LE1, the second lead LE2, and the third, lead LE3 on the front surface (or the rear surface) (the lead width LEW) and smaller than or equal to (lead width LEW+(lead width LEW×0.1)×2). For example, when the lead width LEW is 0.5 mm, the width W4 of the upper surface of the protrusion portion is set to 0.5 mm or more and 0.6 (=0.5+(0.5×0.1)×2) mm or less.

The width of the groove portions of the upper die SU2 is not constant and the cross-sections of the groove portions have a tapered shape so as to correspond to the protrusion portions of the lower die SD2. Although the bottom surfaces of the groove portions, which press the tip portion LE1c of the first lead LE1, the tip portion LE2c of the second lead LE2, and the tip portion LE3c of the third lead LE3, are flat, the farther from the bottom surfaces of the groove portions, the larger the width of the groove portions. The width W5 of the bottom surface of the groove portion is set to be larger than the lead width LEW.

The angle $\theta 1$ between two walls of the protrusion portion of the lower die SD2 and the angle $\theta 2$ between two walls of the groove portion of the upper die SU2 are set to be larger than 0 degrees and smaller than or equal to 90 degrees.

Since the groove portions of the upper die SU2 have a tapered shape, it is possible to more easily draw the first lead LE1, the second lead LE2, and the third lead LE3 into the groove portions as compared with a shape in which the side walls of the groove portion are substantially perpendicular to the bottom surface of the groove portion as in the spanking die SDM1 described in the first embodiment. Since the protrusion portions of the lower die SD2 have a tapered shape, it is possible to smoothly send the first lead LE1, the second lead LE2, and the third lead LE3 to the bottom surfaces of the groove portions of the upper die SU2 when the groove portions and the protrusion portions engage with each other. These features exert effects in particular when the lengths of the first lead LE1, the second lead LE2, and the third lead LE3 become large and variation (unevenness) of the tip portions LE1c, LE2c, and LE3c of the first lead LE1, the second lead LE2, and the third lead LE3 becomes large.

In addition, the angles $\theta 1$ and $\theta 2$ should be smaller than 90 degrees. When the angles $\theta 1$ and $\theta 2$ are smaller than 90 degrees, it is possible to ensure the drawing effect of the tip portion LE1c of the first lead LE1, the tip portion LE2c of the second lead LE2, and the tip portion LE3c of the third lead LE3.

As shown in FIGS. 27, 28, and 30, a pressing surface of a lower die fixing portion FSD of the lower die SD2 and a pressing surface of an upper die fixing portion FSU of the upper die SU2, which press the bent portion LE2b of the second lead LE2 and the bent portion LE3b of the third lead LE3, are flat.

Next, a procedure for lead tip alignment performed by using the spanking die shown in FIGS. 27 to 30 described above will be described.

First, the upper surfaces of the three protrusion portions provided on the lower die guide portion GSD of the lower die SD2 are caused to face the rear surface of the tip portion LE1c of the first lead LE1, the rear surface of the tip portion LE2c of the second lead LE2, and the rear surface of the tip portion LE3c of the third lead LE3, respectively. A flat pressing surface provided on the lower die fixing portion FSD of the lower die SD2 is caused to face the rear surface of the bent portion LE2b of the second lead LE2 and the rear surface of the bent portion LE3b of the third lead LE3. Then, the first lead LE1, the second lead LE2, and the third lead LE3 are mounted over the pressing surface of the lower die SD2.

Next, the bottom surfaces of the three groove portions provided in the upper die guide portion GSU of the upper die SU2 are caused to face the front surface of the tip portion LE1c of the first lead LE1, the front surface of the tip portion LE2c of the second lead LE2, and the front surface of the tip portion LE3c of the third lead LE3, respectively. A flat pressing surface provided on the upper die fixing portion FSU of the upper die SU2 is caused to face the front surface of the bent portion LE2b of the second lead LE2 and the front surface of the bent portion LE3b of the third lead LE3. Then, the first lead LE1, the second lead LE2, and the third lead LE3 are pressed.

In this way, when the spanking die SDM2 is used, in the same manner as in the first embodiment described above, the processing strain of the bent portion LE2b of the second lead LE2 and the bent portion LE3b of the third lead LE3 can be eliminated (or reduced as much as possible or canceled). Because of this, the tip portions LE1c, LE2c, and LE3c of the first lead LE1, the second lead LE2, and the third lead LE3 can be aligned, and thus it is possible to stabilize the pitch between the tip portion LE1c of the first lead LE1 and the tip portion LE2c of the second lead LE2 and the pitch between the tip portion LE1c of the first lead LE1 and the tip portion LE3c of the third lead LE3.

In the second embodiment described above is used the spanking die SDM2 in which three protrusion portions are provided on the pressing surface of the lower die guide portion GSD of the lower die SD2 and three groove portions are provided in the pressing surface of the upper die guide portion GSU of the upper die SU2 so as to correspond to the three protrusion portions provided on the lower die guide portion GSD of the lower die SD2, but this is not limiting.

For example, as shown in FIG. 31, a spanking die SDM2a may be used and in such spanking die SDM2a three groove portions are provided in the pressing surface of the lower die guide portion GSD of the lower die (second die) SD2a and three protrusion portions are provided on the pressing surface of the upper die guide portion GSU of the upper die (first die)

SU2a so as to correspond to the three groove portions provided in the lower die guide portion GSD of the lower die SD2a.

In this case, first, the bottom surfaces of the three groove portions provided in the lower die guide portion GSD of the lower die SD2a are caused to face the rear surface of the tip portion LE1c of the first lead LE1, the rear surface of the tip portion LE2c of the second lead LE2, and the rear surface of the tip portion LE3c of the third lead LE3, respectively. A flat pressing surface provided on the lower die fixing portion FSD of the lower die SD2a is caused to face the rear surface of the bent portion LE2b of the second lead LE2 and the rear surface of the bent portion LE3b of the third lead LE3. Then, the first lead LE1, the second lead LE2, and the third lead LE3 are mounted over the pressing surface of the lower die SD2a.

Next, the upper surfaces of the three protrusion portions provided on the upper die guide portion GSU of the upper die SU2a are caused to face the front surface of the tip portion LE1c of the first lead LE1, the front surface of the tip portion LE2c of the second lead LE2, and the front surface of the tip portion LE3c of the third lead LE3, respectively. A flat pressing surface provided on the upper die fixing portion FSU of the upper die SU2a is caused to face the front surface of the bent portion LE2b of the second lead LE2 and the front surface of the bent portion LE3b of the third lead LE3. Then, the first lead LE1, the second lead LE2, and the third lead LE3 are pressed.

As described above, whether the protrusion portions or the groove portions are provided on the pressing surface of the lower die guide portion GSD and the pressing surface of the upper die guide portion GSU is not limited. The effects of these cases are the same as those described in the first embodiment.

In the second embodiment described above, the pressing surface of the lower die fixing portion FSD of the lower dies SD2 and SD2a and the pressing surface of the upper die fixing portion FSU of the upper die SU2 and SU2a, which press the bent portion LE2b of the second lead LE2 and the bent portion LE3b of the third lead LE3, have a planar shape, but this is not limiting. For example, the pressing surfaces may have a comb teeth shape in the same manner as the pressing surface of the lower die guide portion GSD of the lower dies SD2 and SD2a and the pressing surface of the upper die guide portion GSU of the upper dies SU2 and SU2a. The effect of the above is the same as that described in the first embodiment.

<<Modification>>

In the second embodiment described above, the three-terminal semiconductor device is exemplified as the semiconductor device including a plurality of leads and the lead tip alignment step for forming the tip portions of the three leads included in the three-terminal semiconductor device is described. Here, as a modification, a lead tip alignment step for forming tip portions of five leads included in a five-terminal semiconductor device will be described.

Figure 32A:
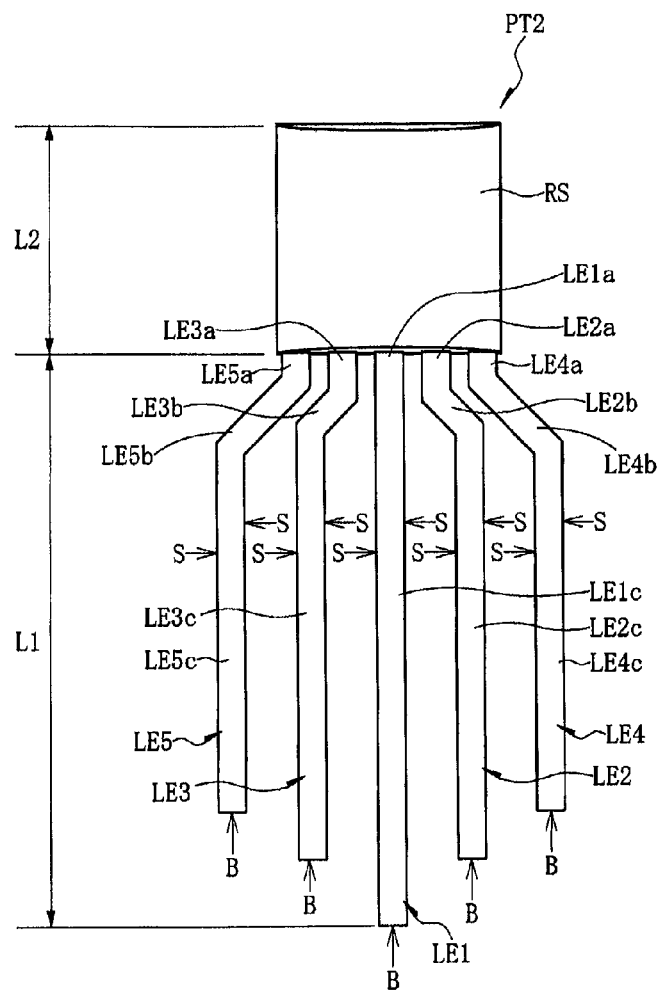
FIGS. 32A and 32B are a front view and a bottom view, respectively, of a five-terminal semiconductor device according to a modification of the second embodiment.
Figure 32B:
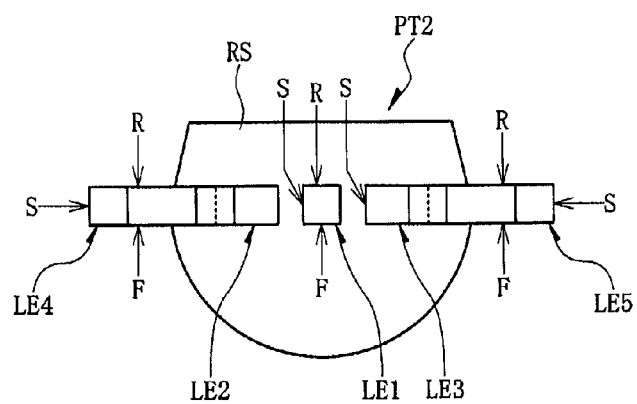

First, a structure of the five-terminal semiconductor device will be described with reference to FIGS. 32A and 32B. FIGS. 32A and 32B show a front view and a bottom view, respectively, of the five-terminal semiconductor device.

As shown in FIGS. 32A and 32B, a five-terminal semiconductor device PT2 has a structure in which five leads, which are a first lead LE1, a second lead LE2, a third lead LE3, a fourth lead LE4, and a fifth lead LE5, protrude from a lower surface of a resin sealing body RS that seals a semiconductor chip.

The fourth lead LE4 and the fifth lead LE5 are spaced apart from each other and protrude from the lower surface of the resin sealing body RS. In addition, between the fourth lead LE4 and the fifth lead LE5, the first lead LE1 is spaced apart from the fourth lead LE4 and the fifth lead LE5, and protrudes from the lower surface of the resin sealing body RS. Furthermore, between the first lead LE1 and the fourth lead LE4, the second lead LE2 is spaced apart from the first lead LE1 and the fourth lead LE4 and protrudes from the lower surface of the resin sealing body RS. Moreover, between the first lead LE1 and the fifth lead LE5, the third lead LE3 is spaced apart from the first lead LE1 and the fifth lead LE5 and protrudes from the lower surface of the resin sealing body RS.

Therefore, the second lead LE2 and the third lead LE3 are located outside the first lead LE1 and furthermore the fourth lead LE4 and the fifth lead LE5 are located outside the second lead LE2 and the third lead LE3.

The first lead LE1 includes a linear-shaped root portion (first portion) LE1a in contact with the lower surface of the resin sealing body RS and a linear-shaped tip portion (second portion) LE1c coupled to the root portion LE1a.

In contrast, the second lead LE2 includes a root portion (first portion) LE2a, a bent portion (second portion) LE2b, and a tip portion (third portion) LE2c and the third lead LE3 includes a root portion (first portion) LE3a, a bent portion (second portion) LE3b, and a tip portion (third portion) LE3c. In contrast, the fourth lead LE4 includes a root portion (first portion) LE4a, a bent portion (second portion) LE4b, and a tip portion (third portion) LE4c and the fifth lead LE5 includes a root portion (first portion) LE5a, a bent portion (second portion) LE5b, and a tip portion (third portion) LE5c.

The cross-sectional shape of the first lead LE1, the second lead LE2, the third lead LE3, the fourth lead LE4, and the fifth lead LE5 is rectangular. In the description below, surfaces of the first lead LE1, the second lead LE2, the third lead LE3, the fourth lead LE4, and the fifth lead LE5 are referred to as a front surface (first surface), a rear surface (second surface), a side surface (third surface), and a bottom surface (fourth surface). The front surface is a surface indicated by a symbol F in FIG. 32B. The rear surface is a surface indicated by a symbol R in FIG. 32B (a surface opposite to the front surface). The side surface is a surface indicated by a symbol S in FIGS. 32A and 32B. The bottom surface is a surface indicated by a symbol B in FIGS. 32A.

A length of a side of a cross-section of the first lead LE1, the second lead LE2, the third lead LE3, the fourth lead LE4, and the fifth lead LE5 on the front surface and the rear surface (a lead width) is longer than a length of a side of a cross-section of the first lead LE1, the second lead LE2, the third lead LE3, the fourth lead LE4, and the fifth lead LE5 on the side surface (a lead thickness (depth)). For example, the length of a side of a cross-section of the first lead LE1, the second lead LE2, the third lead LE3, the fourth lead LE4, and the fifth lead LE5 on the front surface and the rear surface (the lead width) is 0.5 mm. For example, the length of a side of a cross-section of the first lead LE1, the second lead LE2, the third lead LE3, the fourth lead LE4, and the fifth lead LE5 (the lead thickness) is 0.4 mm.

A lead length of the first lead LE1 protruding from the lower surface of the resin sealing body RS is twice or more a length of the resin sealing body RS in a direction in which the first lead LE1 extends. For example, the lead length L1 of the first lead LE1 protruding from the lower surface of the resin sealing body RS is 12.5 mm and the sealing body length L2 of the resin sealing body RS in a direction in which the first lead LE1 extends is 5.0 mm.

In the same manner as in the three-terminal semiconductor device PT1, the tip portions LE1c, LE2c, LE3c, LE4c, and LE5c of the first lead LE1, the second lead LE2, the third lead LE3, the fourth lead LE4, and the fifth lead LE5, which are provided in the five-terminal semiconductor are aligned by using the spanking die.

Figure 33:
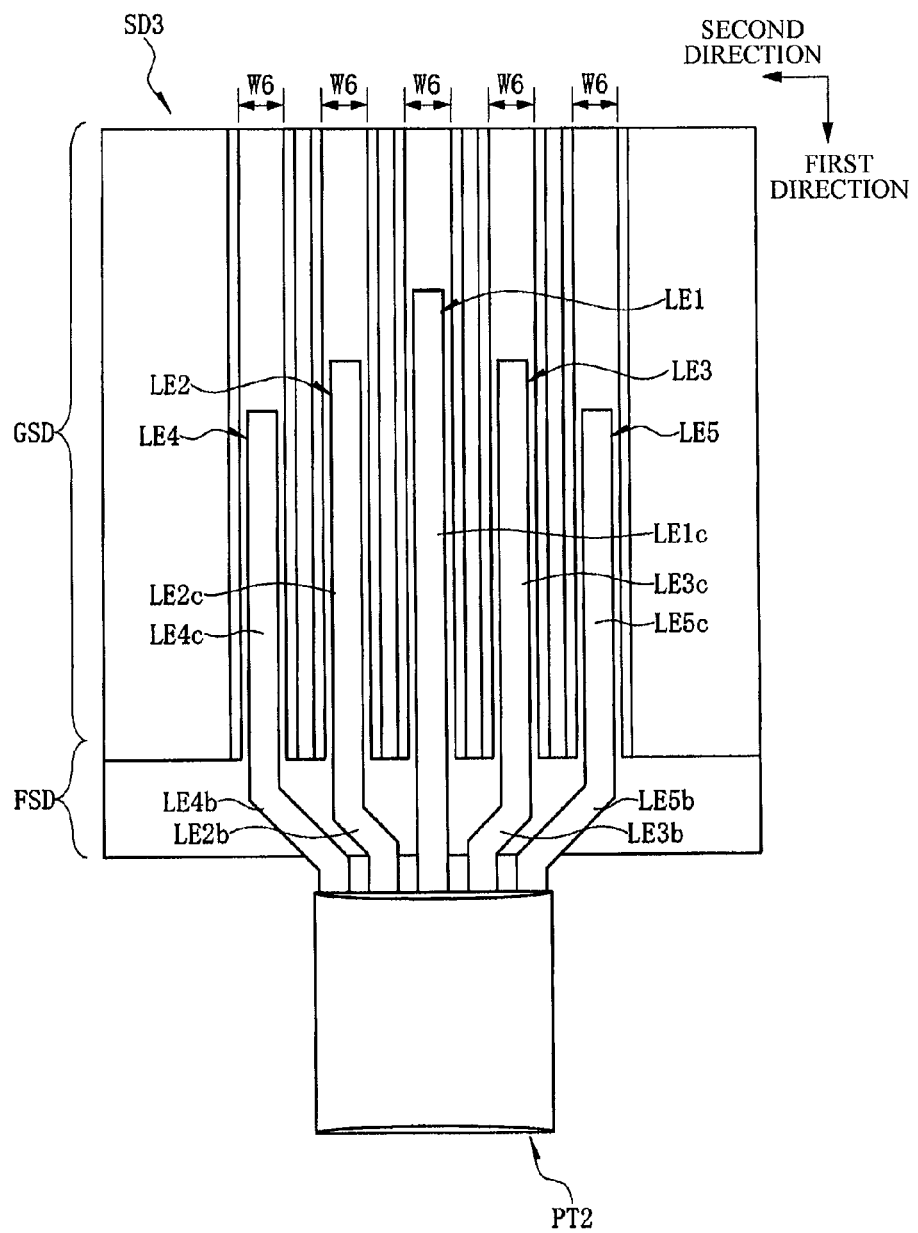
FIG. 33 is a principle part plan view showing a lower die of a spanking die and the semiconductor device in a lead tip alignment step according to the modification of the second embodiment.
Figure 34:
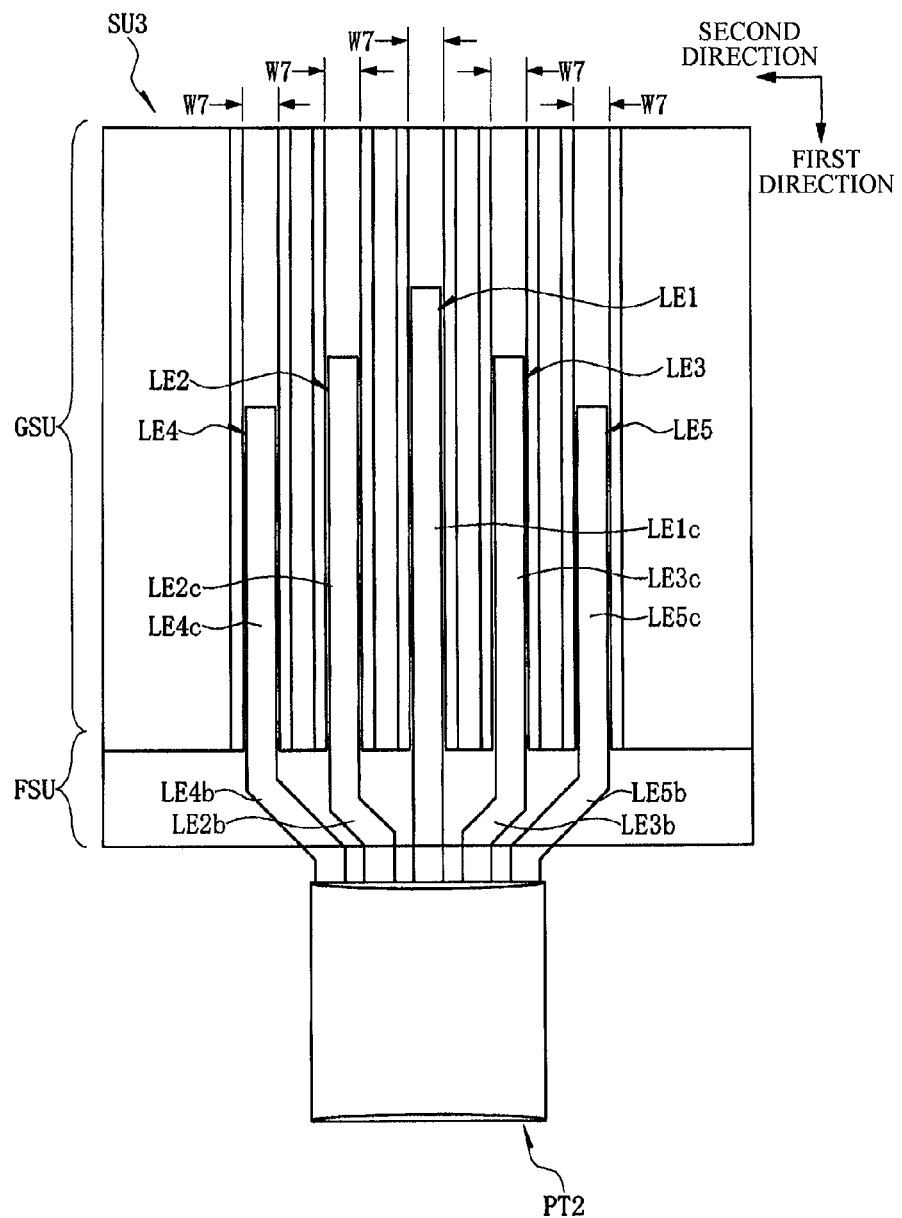
FIG. 34 is a principle part plan view showing an upper die of the spanking die and the semiconductor device in the lead tip alignment step according to the modification of the second embodiment as seen through the upper die.
Figure 35:
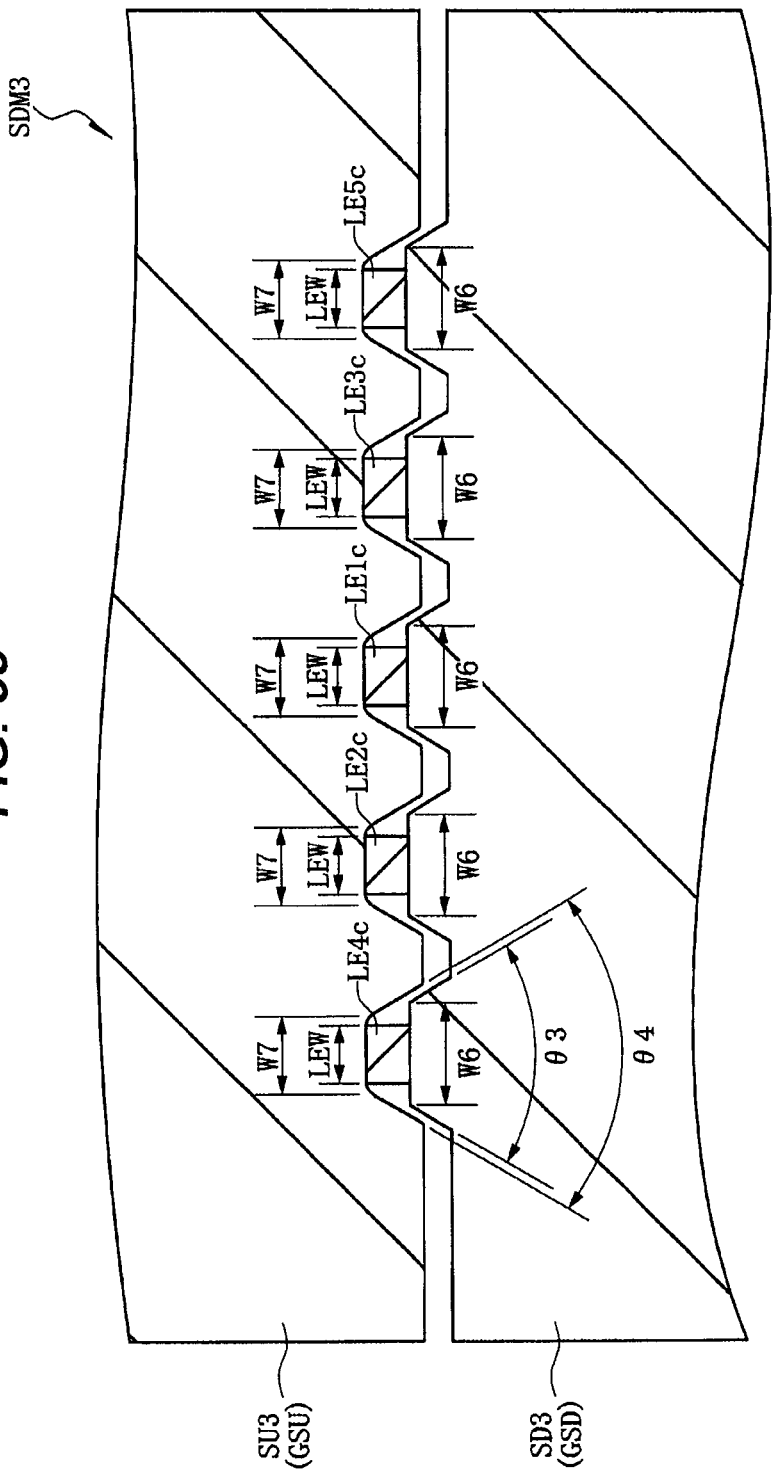
FIG. 35 is a principle part cross-sectional view showing tip portions of leads pressed by the spanking die in the lead tip alignment step according to the modification of the second embodiment.

Next, the spanking die used in the lead tip alignment step which is one of manufacturing processes of the five-terminal semiconductor device PT2 will be described with reference to FIGS. 33 to 37. FIG. 33 is a principle part plan view showing a lower die of the spanking die and the semiconductor device in the lead tip alignment step. FIG. 34 is a principle part plan view showing an upper die of the spanking die and the semiconductor device in the lead tip alignment step as seen through the upper die. FIG. 35 is a principle part cross-sectional view showing tip portions of the leads pressed by the spanking die in the lead tip alignment step. FIG. 36 is a principle part cross-sectional view showing bent portions of the leads pressed by the spanking die in the lead tip alignment step. FIG. 37 is a principle part plan view showing another example of the bent portions of the leads pressed by the spanking die in the lead tip alignment step.

The spanking die SDM3 including the lower die (second die) SD3 shown in FIG. 33 and the upper die (first die) SU3 shown in FIG. 34 is used. The semiconductor device PT2 is sandwiched between the lower die SD3 and the upper die SU3 and the tip portion LE1c of the first lead LE1, the bent portion LE2b and the tip portion LE2c of the second lead LE2, the bent portion LE3b and the tip portion LE3c of the third lead LE3, the bent portion LE4b and the tip portion LE4c of the fourth lead LE4, and the bent portion LE5b and the tip portion LE5c of the fifth lead LE5 are pressed. Because of this, the tip portion LE1c of the first lead LE1, the tip portion LE2c of the second lead LE2, the tip portion LE3c of the third lead LE3 the tip portion LE4c of the fourth lead LE4, and the tip portion LE5c of the fifth lead LE5 are aligned.

As shown in FIGS. 33, 34, and 35, five protrusion portions (convex portions) extending in the first direction are provided spaced apart from each other on the pressing surface of the lower die guide portion GSD of the lower die SD3. Five groove portions (concave portions), which extend in the first direction so as to correspond to the five protrusion portions provided on the lower die guide portion GSD of the lower die SD3, are provided spaced apart from each other in the pressing surface of the upper die guide portion GSU of the upper die SU3.

The cross-sections of the protrusion portions of the lower die SD3 have a tapered shape and the cross-sections of the groove portions of the upper die SU3 have a tapered shape so as to correspond to the protrusion portions of the lower die SD3. For example, the width W6 of the upper surfaces of the protrusion portions is set to be larger than or equal to the length of a side of a cross-section of the first lead LE1, the second lead LE2, the third lead LE3, the fourth lead LE4, and the fifth lead LE5 on the front surface (or the rear surface) (the lead width LEW) and smaller than or equal to (lead width LEW+(lead width LEW×0.1)×2). The width W7 of the bottom surface of the groove portion is set to be larger than the lead width LEW. The angle θ3 between two walls of the protrusion portion of the lower die SD3 and the angle θ4 between two walls of the groove portion of the upper die SU3 are set to be larger than 0 degrees and smaller than or equal to 90 degrees.

In contrast, as shown in FIGS. 33, 34, and 36, a pressing surface of a lower die fixing portion FSD of the lower die SD3 and a pressing surface of an upper die fixing portion FSU of the upper die SU3, which press the bent portion LE2b of the second lead LE2, the bent portion LE3b of the third lead LE3, the bent portion LE4b of the fourth lead LE4, and the bent portion LE5b of the fifth lead LE5, are flat.

In this way, also in the five-terminal semiconductor device, in the same manner as in the three-terminal semiconductor device, the processing strain of the bent portions LE2b, LE3b, LE4b, and LE5b of the second lead LE2, the third lead LE3, the fourth lead LE4, and the fifth lead LE5 can be eliminated (or reduced as much as possible or canceled). Because of this, the tip portions LE1c, LE2c, LE3c, LE4c, and LE5c of the first lead LE1, the second lead LE2, the third lead LE3, the fourth lead LE4, and the fifth lead LE5 can be aligned. As a result, it is possible to stabilize the pitch between the tip portion LE1c of the first lead LE1 and the tip portion LE2c of the second lead LE2, the pitch between the tip portion LE2c of the second lead LE2 and the tip portion LE4c of the fourth lead LE4, the pitch between the tip portion LE1c of the first lead LE1 and the tip portion LE3c of the third lead LE3, and the pitch between the tip portion LE3c of the third lead LE3 and the tip portion LE5c of the fifth lead LE5.

In the modification of the second embodiment described above is used the spanking die SDM3 in which five protrusion portions are provided on the pressing surface of the lower die guide portion GSD of the lower die SD3 and five groove portions are provided in the pressing surface of the upper die guide portion GSU of the upper die SU3 so as to correspond to the five protrusion portions provided on the lower die guide portion GSD of the lower die SD3, but this is not limiting.

For example, as shown in FIG. 37, a spanking die SDM3a may be used and in such spanking die SDM3a five groove portions are provided in the pressing surface of the lower die guide portion GSD of the lower die (second die) SD3a and five protrusion portions are provided on the pressing surface of the upper die guide portion GSU of the upper die (first die) SU3a so as to correspond to the five groove portions provided in the lower die guide portion GSD of the lower die SD3a.

While the invention made by the inventors has been specifically described on the basis of the embodiments, it is needless to say that the present invention is not limited to the foregoing embodiments, but can be variously modified without departing from the scope of the invention.

For example, although the MOSFET described above is a field effect transistor whose gate insulating film is formed of a silicon oxide ($SiO_2$ or the like) film, this is not limiting, and field effect transistors (MISFETs (Metal Insulator Semiconductor Field Effect Transistors)) whose gate insulating film is formed of an insulting film other than a silicon oxide film are not excluded.

What is claimed is:

1. A manufacturing method of a semiconductor device, comprising the steps of:
   (a) providing a semiconductor chip including a front surface and a back surface opposite to the front surface;
   (b) providing a lead frame including a first surface and a second surface opposite to the first surface, and having a chip mounting portion, a first lead connected to the chip mounting portion, a second lead arranged spaced apart from the first lead and a holding portion connecting the first lead with the second lead, the second lead being arranged adjacent to the chip mounting portion and the first lead in a plan view;
   (c) mounting the semiconductor chip over the chip mounting portion such that the back surface of the semiconductor chip faces the first surface of the chip mounting portion;
   (d) electrically coupling a first electrode pad formed on the surface of the semiconductor chip and the second lead via a bonding wire;

(e) forming a resin sealing body, by sealing the semiconductor chip, the chip mounting portion, a part of the first lead, and a part of the second lead with resin;

(f) separating the first lead and the second lead from each other by removing the holding portion, wherein a part of the second lead which is exposed from the resin sealing body has a first part including a tip portion of the second lead, a second part close to the resin sealing body, and a third part between the first part and the second part, (g) after the step (f), deforming the second lead such that a distance between the first part of the second lead and the first lead is greater than a distance between the second part of the second lead and the first lead in plan view; and (h) after the step (g), pressing the third part of the second lead with a die.

2. The manufacturing method of a semiconductor device according to claim 1, wherein the die has a first die including a first fixing portion and a groove portion extending in a first direction, and a second die including a second fixing portion and a protrusion portion extending in the first direction corresponding to the groove portion of the first die, and further in the step (h), the third part of the second lead is pressed with both the first fixing portion and the second fixing portion in a thickness direction of the second lead by pressing the first fixing portion and the second fixing portion toward each other, and the first part of the second lead is pressed with both the groove portion and the protrusion portion in the thickness direction of the second lead.

3. The manufacturing method of a semiconductor device according to claim 2, wherein a surface of the first fixing portion of the first die facing one of a first surface and a second surface of the third part of the second lead is flat and a surface of the second fixing portion of the second die facing the other one of the first surface and the second surface of the third part of the second lead is flat.

4. The manufacturing method of a semiconductor device according to claim 2, wherein a width of the upper surface of the protrusion portion of the second die facing one of a first surface and a second surface of the first part of the second lead, in a second direction perpendicular to the first direction, is greater than or equal to a lead width of the second lead and smaller than or equal to (the lead width of the second lead +(the lead width of the second lead ×0.1)×2).

5. The manufacturing method of a semiconductor device according to claim 2, wherein in a cross-section along a second direction perpendicular to the first direction, a cross-sectional shape of the protrusion portion of the second die is a tapered shape and a width of the upper surface of the protrusion portion facing one of a first surface and a second surface of the first part of the second lead, in the second direction, is less than a width of the other portion of the protrusion portion in the second direction.

6. The manufacturing method of a semiconductor device according to claim 2, wherein a width of a surface of the groove portion of the first die facing one of a first surface and a second surface of the first part of the second lead, in a second direction perpendicular to the first direction, is greater than a lead width of the second lead.

7. The manufacturing method of a semiconductor device according to claim 2, wherein in a cross-section along a second direction perpendicular to the first direction, a cross-sectional shape of the groove portion of the first die is a tapered shape and a width of a surface of the groove portion facing one of a first surface and a second surface of the first part of the second lead, in the second direction, is less than a width of the other portion of the groove portion in the second direction.

8. The manufacturing method of a semiconductor device according to claim 1, wherein a cross-sectional shape of the second lead is rectangular.

9. The manufacturing method of a semiconductor device according to claim 8, wherein a lead width of the second lead is greater than a lead thickness of the second lead.

10. The manufacturing method of a semiconductor device according to claim 1, wherein a length of the first lead exposed from the resin sealing body is twice or more a length of the resin sealing body in a direction in which the first lead extends.

11. The manufacturing method of a semiconductor device according to claim 1, wherein a power MOSFET including a source, a drain, and a gate is formed in the semiconductor chip, the first lead is electrically coupled with the drain of the power MOSFET via a second electrode pad formed on the back surface of the semiconductor chip, and the second lead is electrically coupled with the source or the gate of the power MOSFET via the first electrode pad formed on the front surface of the semiconductor chip and the bonding wire.

12. The manufacturing method of a semiconductor device according to claim 1, wherein in the plan view, the first lead and second lead protrude from the same side of the resin sealing body.

13. The manufacturing method of a semiconductor device according to claim 12, wherein in the step (g), the second lead is deformed such that the first and second parts of the second lead extend along a direction which is substantially parallel to an extending direction of the first lead.

* * * * *